(12) United States Patent
Takahara

(10) Patent No.: US 7,075,109 B2
(45) Date of Patent: Jul. 11, 2006

(54) ELECTRO-OPTICAL HAVING A CONFIGURATION TO PREVENT GENERATION AND TRAPPING OF MATERIAL RESIDUES

(75) Inventor: Kenichi Takahara, Chino (JP)

(73) Assignee: Seiko Epson Corporation, Tokyo (JP)

( * ) Notice: Subject to any disclaimer, the term of this patent is extended or adjusted under 35 U.S.C. 154(b) by 26 days.

(21) Appl. No.: 10/704,569

(22) Filed: Nov. 12, 2003

(65) Prior Publication Data

US 2004/0119071 A1    Jun. 24, 2004

(30) Foreign Application Priority Data

Nov. 29, 2002  (JP) .............................. 2002-348046
Jul. 28, 2003   (JP) .............................. 2003-202639

(51) Int. Cl.
*H01L 29/04*   (2006.01)
*H01L 31/36*   (2006.01)
*H01L 31/376*  (2006.01)
*H01L 31/20*   (2006.01)

(52) U.S. Cl. ........................... 257/59; 257/72; 349/138
(58) Field of Classification Search ................. 257/59, 257/72, 774; 349/138
See application file for complete search history.

(56) References Cited

U.S. PATENT DOCUMENTS

| 3,966,305 | A | * | 6/1976 | Young ........................ 349/132 |
| 5,422,293 | A | * | 6/1995 | Konya ........................ 438/155 |
| 5,523,865 | A | * | 6/1996 | Furuta et al. ................. 349/42 |
| 6,172,721 | B1 | * | 1/2001 | Murade et al. ............... 349/43 |
| 6,847,050 | B1 | * | 1/2005 | Yamazaki et al. ............ 257/59 |

FOREIGN PATENT DOCUMENTS

| JP | A-10-288794  | 10/1998 |
| JP | A-2000-258796 | 9/2000 |
| JP | A-2000-305072 | 11/2000 |
| JP | A-2001-142414 | 5/2001 |

* cited by examiner

*Primary Examiner*—Howard Weiss
(74) *Attorney, Agent, or Firm*—Oliff & Berridge, PLC

(57) ABSTRACT

An electro-optical device for a liquid-crystal apparatus includes TFTs provided above a substrate, pixel electrodes that are provided above the TFTs and that are connected to corresponding relay electrodes via contact holes, a protection insulating film that is provided on the pixel electrodes from the gaps between the pixel electrodes to the edge portions thereof so as to cover end surfaces of the edge portions of the pixel electrodes, and an alignment layer that is provided on a surface including the protection insulating film and that is rubbed. Material residues of the alignment layer are reduced or prevented from being generated or trapped in the vicinities of the edges of the pixel electrodes and in the vicinities of the contact holes. Consequently, brightness irregularities or display irregularities are reduced.

18 Claims, 15 Drawing Sheets

ELECTRO-OPTICAL HAVING A CONFIGURATION TO PREVENT GENERATION AND TRAPPING OF MATERIAL RESIDUES

BACKGROUND OF THE INVENTION

1. Field of Invention

The present invention relates to a technical field of an electro-optical device, such as a liquid crystal device, a manufacturing method therefor, and an electronic apparatus, such as a liquid crystal projector having the electro-optical device.

2. Description of Related Art

In general, an electro-optical device has a configuration in which electro-optic material, such as liquid crystal, is sandwiched between a pair of substrates, above one of which, pixel electrodes for pixels are provided so as to face the liquid crystal. In this case, the pixel electrodes are arranged in a matrix at a constant pitch (hereinafter referred to as "a pixel pitch" as appropriate). The surfaces of the pixel electrodes or the substrate surface that is in contact with the liquid crystal and the like are provided with an alignment layer for defining the operational state of the electro-optic material, such as the alignment state of the liquid crystal. In addition, each pixel electrode has a thin-film transistor (hereinafter referred to as a "TFT") for controlling the switching of the corresponding pixel electrode, and the TFT has a scan line for supplying a scan signal and a data line for supplying an image signal. The opposing substrate, which is the other substrate of the pair of substrate, has an opposing electrode. During operation, a drive electric field is applied to the liquid crystal between the opposing substrate and the pixel electrodes whose switching is controlled by the TFTs to thereby drive the liquid crystal and the like for each pixel.

With this type of electro-optical device, when the substrate surface that faces the liquid crystal and the like has protrusions/depressions or steps, the operational state of the electro-optic material, such as the alignment state of the liquid crystal becomes unstable. Thus, since the scan lines, data lines, TFTs, and the like are fabricated in layers below the pixels electrodes above the substrate, if no measure is taken, such protrusions/depression or steps are generated because of the presence of those various wires and electronic elements.

Accordingly, a technique in which depressions are provided in the substrate and various wires and electronic elements are buried therein has been developed for reducing the protrusions/depression or steps that are generated at the substrate surface facing the liquid crystal and the like. In addition, a technique in which a CMP (chemical mechanical polishing) process is performed on the surface of an inter-layer insulating film that is positioned at the uppermost layer and that serves as an underlying layer for the pixel electrodes has also been developed.

Meanwhile, this type of electro-optical device employs a row-direction inversion drive system (hereinafter referred to as a "1H inversion drive system") in which the potential polarities for driving pixel electrodes are reversed for each pixel row for each field or a column-direction inversion drive system (hereinafter referred to as a "1S inversion drive system") in which the potential polarities are reversed for driving for each pixel column, for the purpose of preventing a DC voltage from being applied to the liquid crystal and the like or preventing flicker. When such an inversion drive system is employed, lateral electric fields are generated between adjacent pixel electrodes. As a result, in the electro-optical device that is intended to be driven with longitudinal electric fields perpendicular to the substrate surface, a displayed image is disturbed in accordance with the strength of the lateral electric fields. Accordingly, in the related art, a technique have been developed for forming a protecting insulating film for reducing lateral electric fields in regions where no pixel apertures are provided along the scan lines or data lines, the regions being regions where lateral electric fields are generated. In the technique, depression portions are provided in the substrate and various wires and electronic elements are partially buried and not partially buried therein.

The related art technologies, however, cannot cope with steps caused by the presence of the pixel electrodes themselves. That is, steps in accordance with the film thickness of the pixel electrodes are generated at edges of the pixel electrodes that are provided in a plane with gaps therebetween. In addition, these techniques typically cannot cope with depressions that are generated in the surfaces of the pixel electrodes so as to correspond to the openings of contact holes for directly or indirectly connecting the pixel electrodes to the thin-film transistors.

Further, the steps in the vicinities of the edges of such pixel electrodes or depressions in the vicinities of the contact holes cause polyimide residues or the like to be generated or trapped when the alignment layer formed of polyimide or the like on the pixel electrodes is rubbed. In addition thereto or in place thereof, the residues may be suspended in the liquid crystal in a process after rubbing. The material residues from the alignment layer pose a technical problem in brightness irregularities or display irregularities occur in an image eventually displayed.

In particular, as the pixel pitch is further reduced so as to meet a general requirement for displaying a higher-definition image to further reduce the gap between the substrate, the steps or depressions in the vicinities of the contact holes due to the presence of the pixel electrodes relatively become large. On the other hand, a reduction in the pixel pitch causes the size of the polyimide residues or the like to increase relatively. Thus, the technical problem due to such residues generated or trapped in the vicinities of the edges of the pixel electrodes or in the vicinities of the contact holes and due to residues suspended in the electro-optic material becomes more severe.

SUMMARY OF THE INVENTION

The present invention has been made to address the foregoing problems. The present invention provides an electro-optical device that has reduced impurities, such as material residues of an alignment layer, in the vicinities of the edges of pixel electrodes or in the vicinities of contact holes and reduced impurities suspended in electro-optic material and that is capable of displaying a high-definition image having reduced brightness irregularities or display irregularities, a manufacturing method therefor; and an electronic apparatus having such an electro-optical device.

To address the foregoing problems, an electro-optical device of an aspect of the present invention includes electro-optic material sandwiched between a pair of substrates; a plurality of pixel electrodes that are arranged with gaps therebetween in plan view above one of the substrates, an underlying layer that underlies the pixel electrodes; wires and/or electronic elements which are provided below the underlying layer and which are electrically connected to the pixel electrodes; a protection insulating film that is formed on at least part of the underlying layer in the gaps and that is formed on edge portions of the pixel electrodes so as to cover end surfaces of the edge portions of the pixel electrodes; and an alignment layer that are provided on a surface including the protection insulating film and the center of the pixel electrodes and that are rubbed in a predetermined direction.

According to an electro-optic device of an aspect of the present invention, during operation, image signals are supplied to thin-film transistors, which are one example of the electronic elements, through data lines, which are one example of the wires, and scan signals are supplied to the thin-film transistors through scan lines, which are another example of the wires. Then, for example, the thin-film transistors control the switching of the pixel electrodes, which are connected to the thin-film transistors, so that the pixel electrodes can be driven by an active-matrix drive system.

On the opposing substrate that opposes such a substrate, an opposing electrode is provided so as to oppose the pixel electrodes with the electro-optic material, such as liquid crystal, interposed therebetween. A voltage is applied between the opposing electrode and the pixel electrodes. In the case of a lateral-electric field driving system, such an opposing electrode is not needed and a voltage is applied between the adjacent pixel electrodes. Alternatively, the pixel electrodes may be configured so as to perform active matrix driving with thin-film diodes, which are one example of the electronic elements, or may be configured so that image signals and the like are supplied to pixel electrodes having various shapes, such as an island shape, a striped shape, or segmented shape, without being passed through electronic elements.

In an aspect of the present invention, particularly, the protection insulating film is formed in the gaps between the pixel electrodes on at least part of the underlying layer and is also formed to lie on the edge portions of the pixel electrodes. Thus, the protection insulating film is provided so as to cover the end surfaces of edge portions of the pixel electrodes. Such a protection insulating film is provided, for example, by patterning a transparent insulating film containing silicon oxide, silicon nitride, or the like. The alignment layer is provided on a surface including the protection insulating film and the center portions of the pixel electrodes and is rubbed in a predetermined rubbing direction. Since the edges of the pixel electrodes are covered with the insulating film, the heights of steps in the vicinities of the pixel electrodes are reduced. Thus, the amount of material residues of the alignment layer which are generated in the vicinities of edges of the pixel electrodes during the rubbing process of the alignment layer containing polyimide or the like can be efficiently reduced. In addition, it is possible to effectively reduce or prevent an event that the edges of the pixel electrodes and the alignment layer provided thereon locally or microscopically peel off at the time of rubbing. As a result, material residues of the alignment layer which are generated in conjunction with the peeling off are also reduced. Further, rubbing failure that occurs in conjunction with the peeling-off can also be reduced consequently. In addition, for example, it is also possible to effectively reduce or prevent material residues generated as described above from being suspended in the electro-optic material, such as liquid crystal.

Furthermore, the protection insulating film is formed so as to overlap the gaps between the pixel electrodes and the edge portions of the pixel electrodes, and there is no need to form the protection insulating film at the center portions of the pixel electrodes which occupy pixel aperture regions used for display. Thus, the presence of the protection insulating film reduces or prevents a burn-in phenomenon of a displayed image in the aperture regions used for display.

As a result, the electro-optical device of an aspect of the present invention, for example, can reduce impurities, such as material residues of the alignment layer, in the vicinities of edges of the pixel electrodes, so that impurities suspended in the electro-optic material are also reduced. This makes it possible to display a high-quality image having reduced brightness irregularities or display irregularities. In particular, even when the pixel pitch is reduced to thereby cause, for example, steps at the end surfaces of the pixel electrodes or depressions due to the contact holes to become relatively large or to thereby cause the size of material residues of the alignment layer to become relatively large, the electro-optical device of an aspect of the present invention can efficiently reduce adverse effects caused by those factors. Thus, the electro-optical device of an aspect of the present invention is significantly advantageous in displaying a higher-definition image.

According to another aspect of the electro-optical device of the present invention, the underlying layer is planarized.

According to this aspect, the pixel electrodes are provided on the planarized underlying layer, and the protection insulating film is further provided thereon. Thus, the flatness of the entire surface of the alignment layer, which is in contact with the electro-optic material, can be enhanced, so that the operational failure of the electro-optic material, such as alignment failure of liquid crystal, can be reduced. Moreover, as described above, the protection insulating film can also reduce the heights of steps generated by the presence of the pixel electrodes in the vicinities of edges of the pixel electrodes which have enhanced flatness. Consequently, material residues of the alignment layer can be further reduced.

According to another aspect of the electro-optical device of the present invention, the protection insulating film is planarized.

According to this aspect, the alignment layer is formed on the planarized protection insulating film. Thus, the flatness of the entire surface of the alignment layer, which is in contact with the electro-optic material, can be enhanced, so that the operational failure of liquid crystal, such as alignment failure of liquid crystal, can be reduced. Moreover, as described above, the protection insulating film can also reduce the heights of steps generated by the presence of the pixel electrodes in the vicinities of edges of the pixel electrodes which have enhanced flatness. Consequently, material residues of the alignment layer can be further reduced.

According to another aspect of the electro-optical device of the present invention, the pixel electrodes are connected to the wires and/or electronic elements via corresponding contact holes, and the protection insulating film is formed so as to cover depression portions of the pixel electrodes, the depression portions corresponding to the openings of the contact holes.

According to this aspect, the pixel electrodes are connected to the wires and/or electronic elements via the corresponding contact holes. Thus, depressions are generated in the surfaces of the pixel electrodes so as to correspond to the openings of the contact holes. If the alignment layer is directly formed on the depressions, at the time of rubbing, material residues of the alignment layer are generated or trapped in the vicinities of the depressions, i.e., in the vicinities of steps or protrusions/depressions due to the depressions. In this aspect of the present invention, therefore, the protection insulating film is provided so as to cover not only the edge portions of the pixel electrodes but also the depression portions. As a result, it is possible to effectively reduce or prevent an event that material residues of the alignment layer are generated or trapped in the vicinities of openings of the contact holes.

According to another aspect of the present invention, the electro-optical device further includes a light-shielding film provided above at least one of the substrates, wherein the light-shielding film covers planar regions where the protection insulating film is formed, so as to correspond to regions where no pixel apertures are provided.

According to this aspect, the protection insulating film that occupies all or part of the gaps between the pixel electrodes is covered with a light-shielding film, which is arranged in regions where no pixel apertures are provided. Thus, since the light-shielding film directly faces the protection insulating film, a part of the electro-optic material which deteriorates locally in its operational state becomes substantially irrelevant to actual display, which can reduce or prevent a deterioration in display quality. For example, any electro-optic-material part that is deteriorated by the application of a DC voltage, because of the presence of the protection insulating film, can be made invisible in actual display. In addition, even when the transmittance is reduced because of the presence of the protection insulating film or even when an opaque or light-shielding protection insulating film is used, they are invisible in actual display and thus no particular problem arises.

Such a light-shielding film that defines the regions where no pixel apertures are provided may be provided at one substrate of the substrates or may be provided at the other substrate. Further, part of the light-shielding film may be provided on one substrate and the other part may be provided on the other substrate. In addition, such light-shielding films may be redundantly provided on both of the substrates, or light-shielding films having slightly-varied sizes may be superimposed on the both of the substrate. In particular, when the light-shielding film is provided on the substrate having the pixel electrodes and the like, it is possible to share at least part of the wires, the electronic elements, and the light-shielding film and it is also possible to provide the light-shielding film as a so-called "built-in light-shielding film".

According to another aspect of the present invention, the edge portions of the protection insulating film have, at edges of the edge portions, tapered portions with a taper angle of 45° or less.

According to this aspect of the present invention, the edge portions of the protection insulating film have, at edges of the edge portions, the tapered portions with a taper angle of 45° or less. That is, the edge portions or the end surfaces of the protection insulating film have relatively gentle steps. Thus, even when the alignment layer is formed on the protection insulating film and is rubbed, the amount of generated or trapped material residues of the alignment layer can be reduced according to the gentleness of the steps having the tapered portions. Also, according to the gentleness of the steps, it is also possible to reduce the possibility that the alignment layer is peeled off at the time of rubbing.

According to the aspect with regard to the tapering, preferably, the taper angle is 30° or less.

With this configuration, the edge portions or end surfaces of the protection insulating film have very gentle steps. Thus, even when the alignment layer is formed thereon and is rubbed, it is possible to significantly reduce the amount of generated or trapped material residues of the alignment layer.

According to the aspect with regard to the tapering, of the edge portions of the protection insulating film, the tapered portions may be provided at portions extending in a direction that intersects the predetermined rubbing direction.

With this configuration, the edge portions of the protection insulating film, which are rubbed up or rubbed down at the time of rubbing of the alignment layer, have the tapered portions. Consequently, it is possible to significantly reduce the amount of generated or trapped material residues of the alignment layer which are caused by the steps.

According to another aspect of the electro-optical device of the present invention, the protection insulating film is formed so as not to lie on center portions of the pixel electrodes.

According to this aspect, the protection insulating film is formed so as to lie not on the edge portions of the pixel electrodes but on the center portions of the pixel electrodes. As a result, at the center portions of the pixel electrodes, i.e., in the aperture regions used for actual display, the burn-in phenomenon of a displayed image due to the presence of the protection insulating film can be reduced or prevented from occurring.

According to another aspect of the electro-optical device of the present invention, at least one of the wires and the electronic elements include scan lines and data lines which intersect each other and thin-film transistors that control the switching of the pixel electrodes, scan signals and image signals being supplied to the thin-film transistors through the scan lines and the data lines, respectively. The protection insulating film extends in a striped pattern or a lattice pattern in plan view along the gaps corresponding to the scan lines and the data lines.

According to this aspect, during operation, image signals are supplied to the thin-film transistors through the data lines and scan signals are supplied to the thin-film transistors through the scan signals, so that driving is performed by a TFT-active-matrix drive system. In this case, particularly, the protection insulating film extends in a striped or lattice pattern along the gaps in plan view and also protrudes toward the other substrate. In this aspect, particularly, the underlying layer may be planarized so that no protrusions/depressions are generated at the underlying layer by the constituting elements except the protection insulating film. By doing so, generally, the presence of only the protection insulating film can reduce or prevent an event that material residues of the alignment layer are generated or trapped, as described above, with high reliability.

Further, the protection insulating film extends in a striped pattern along the gaps between two adjacent pixel electrodes that drive the electro-optic material with different polarities from each other relative a reference potential. The regions extending in a striped pattern may have a greater height from the pixel electrodes than the other regions. Also, the protection insulating film is provided in regions in the vicinities of the gaps between two adjacent pixel electrodes that drive the electro-optic material with different polarities from each other relative to a reference potential. Also, the regions in the vicinities of the protection insulating film may have a greater height from the pixel electrodes than the other regions.

For example, when the driving system of the electro-optical device is a 1H inversion driving system, which is a row-direction inversion driving system in which the potential polarities are reversed for each pixel row, the protection insulating film extends in a lattice pattern along the gaps corresponding to the scan lines and the data lines, and also the protection insulating film that extends in the X direction so as to correspond to the scan lines has a greater height from the pixel electrodes than the protection insulating film that extends in the Y-direction so as to correspond to the data lines. Also, the height of the intersection regions in the lattice pattern from the pixel electrodes may be aligned with either of the heights.

Also, when the driving system of the electro-optical device is a 1S inversion driving system, which is a column-direction inversion driving system in which the potential polarities are reversed for each pixel column, the protection insulating film extends in a lattice pattern along the gaps corresponding to the scan lines and the data lines and also the protection insulating film that extends in the X direction, so as to correspond to the scan lines, has a greater height from the pixel electrodes than the protection insulating film that extends in the Y-direction so as to correspond to the data lines. Also, the height of the intersection regions in the lattice pattern from the pixel electrodes may be aligned with either of the heights.

Further, when the driving system of the electro-optical device is a dot inversion driving system in which the potential polarities are reversed to drive for each pixel, the protection insulating film extends in a lattice pattern along the gaps corresponding to the scan lines and the data lines and also the protection insulating film that extends in the X direction so as to correspond to the scan lines has substantially the same height from the pixel electrodes as the protection insulating film that extends in the Y-direction so as to correspond to the data lines.

According to the above configurations, the protection insulating film can reduce the influence that the lateral electric fields generated in the gaps by the reversal of the driving polarities of two adjacent pixel electrodes exert on the electro-optic material. In addition, when the height of the protection insulating film at portions that are irrelevant to the lateral electric fields is reduced relative to the surfaces of the pixel electrodes, it is possible to reduce or prevent the generation of material residues of the alignment layer which are produced by the presence of the protection insulating film having an excess height at the time of rubbing.

In this aspect of the present invention, the pixel electrodes may be driven by potential-polarity reversal via the corresponding thin-film transistors, for each row of pixel electrodes extending in the row direction or for each column of pixel electrodes extending in the column direction, and the protection insulating film may extend in a striped pattern along, of the gaps, gaps where lateral electric fields are generated between the pixel electrodes.

With this configuration, when the 1H inversion driving system is employed for the TFT active-matrix driving system, forming the protection insulating film in a striped pattern along the scan lines can reduce an influence that the lateral electric fields exert on the electro-optic material because of the presence of the protection insulating film. That is, the electric lines of force of the lateral electric fields are reduced by the amount of the electric lines of force of the lateral electric fields which pass through the protection insulating film, thereby reducing an adverse effect of the lateral electric fields correspondingly. Also, with this arrangement, when the 1S inversion driving system is employed, forming the protection insulating film in a striped pattern along the data lines can reduce an influence that the lateral electric fields exert on the electro-optic material because of the presence of the protection insulating film.

Additionally, when a so-called "dot inversion driving system" in which the drive potential polarities are reversed for each pixel, forming the protection insulating film in a lattice pattern along both of the scan lines and the data lines can reduce an influence that the lateral electric fields exert on the electro-optic material because of the presence of the protection insulating film. With this arrangement, in particular, the underlying layer may be planarized so that no protrusions/depressions are generated at the underlying layer by the constituting elements except the protection insulating film. By doing so, generally, the presence of only the protection insulating film can reduce the lateral electric fields, with high reliability.

According to another aspect of the electro-optical device of the present invention, the film thickness of the protection insulating at a portions where the protection insulating film is provided on the edge portions is in the range of one tenth to one fourth the gap between the pair of substrates.

According to this aspect, since the film thickness of the protection insulating film, at portions where the protection insulating film is provided on the edge portions, is in the range of one tenth to one fourth the inter-substrate gap, i.e., the gap between the substrate, it is possible to reduce operational failure of the electro-optic material, such as alignment failure of liquid crystal. Furthermore, it is possible to efficiently reduce or prevent the generation and trapping of material residues of the alignment layer. Additionally, when the inversion driving system as described above is employed, in particular, the presence of the protection insulating film having an adequate height can efficiently reduce the influence of the lateral electric fields.

To address the foregoing problems, a manufacturing method for an electro-optical device according to an aspect of the present invention includes a step of forming wires and/or electronic elements on a substrate; a step of forming an underlying layer above at least one of the wires and the electronic elements; a step of forming a plurality of pixel electrodes that are arranged with gaps therebetween in plan view on the underlying layer and that are connected to at least one of the wires and the electronic elements; a step of forming protection insulating film on at least part of the underlying layer in the gaps and on edge portions of the pixel electrodes so as to cover end surfaces of the edge portions of the pixel electrodes; a step of providing an alignment layer on a surface including the protection insulating film and center portions of the pixel electrodes; and a step of rubbing the alignment layer in a predetermined rubbing direction.

In the manufacturing method for the electro-optical device according to an aspect of the present invention, various wires and electronic elements, such as scan lines, data lines, thin-film transistors, storage capacitors, relay layers, are formed on a substrate. On the various wires and the electronic elements, the underlying layer, which is made of a silicate glass film, silicon oxide film, silicon nitride film, or the like, is formed by a deposition technique, such as sputtering or CVD (chemical vapor deposition). In addition, the pixel electrodes, which are connected to at least one of the wires and the electronic elements via contact holes, are formed on the underlying layer. The pixel electrodes are formed, for example, by depositing ITO (indium tin oxide) films by sputtering or the like and by patterning the resulting films. In addition, the protection insulating film is formed on the edge portions of the pixel electrodes so as to cover the end surfaces of the edge portions of the pixel electrodes.

Such a protection insulating film is provided, for example, by forming a silicon oxide film, a silicon nitride film, or the like by sputtering or CVD and then by patterning the film. Thereafter, over a surface of the substrate after the protection insulating film is formed thereon, the alignment layer containing polyimide or the like is provided and is further rubbed. In this manner, it is possible to relatively efficiently manufacture the above-described electro-optical device of an aspect of the present invention.

In an aspect of the present invention, particularly, the protection insulating film is formed on the edge portions of the pixel electrodes so as to cover the end surfaces of the edge portions of the pixel electrodes, the alignment film is provided thereon, and then is rubbed. Thus, during the rubbing process, it is possible to effectively reduce or prevent material residues of the alignment layer from being generated or trapped at steps in the vicinities of the edges of the pixel electrodes.

According to another aspect of the present invention, the manufacturing method for the electro-optical device further includes a step of planarizing the underlying layer after the step of forming the underlying layer.

According to this aspect, after the underlying layer is planarized, the pixel electrodes and the protection insulating film are formed thereon. As a result, except for steps generated by the presence of the pixel electrodes, such as the edge portions of the pixel electrodes, steps are substantially eliminated from above the pixel electrodes and the underlying layer exposed between the gaps. Thus, the formation of the protection insulating film on the pixel electrodes and the underlying layer can effectively reduce or prevent material residues of the alignment layer from being generated and trapped at steps in the vicinities of the edges of the pixel electrodes.

Further, when an inversion drive method as described above is employed, the protection insulating film can be used to form, with high accuracy, a protection insulating film on the substantially flat surface so as to have a height and shape that are suitable to reduce adverse effects of lateral electronic fields.

According to another aspect of the present invention, the manufacturing method for the electro-optical device further includes a step of providing contact holes to connect the pixel electrodes with at least one of the wires and the electronic elements after the step of planarizing the underlying layer. The step of forming the protection insulating film is performed such that the protection insulating film covers depression portions of the pixel electrodes, the depression portions corresponding to the openings of the contact holes.

According to this aspect, after the underlying layer is planarized, the contact holes are provided.

The contact holes provide connections between the pixel electrodes, which are formed thereabove, and at least one of the wires and the electronic elements, which are fabricated below the pixel electrodes. Thus, depressions are generated in the surfaces of the pixel electrodes so as to correspond to the openings of the contact holes. In this case, if the alignment layer is directly formed on the depressions, at the time of rubbing, material residues of the alignment layer are generated or trapped in the vicinities of the depressions, i.e., in the vicinities of steps or protrusions/depressions due to the depressions. In this aspect of the present invention, therefore, the protection insulating film is provided so as to cover not only the edge portions of the pixel electrodes but also the depression portions. As a result, it is possible to effectively reduce or prevent an event that material residues of the alignment layer are generated or trapped in the vicinities of openings of the contact holes.

According to another aspect of the manufacturing method for the electro-optical device of the present invention, the step of forming the protection insulating film includes a step of forming an insulating film on the pixel electrodes and on the underlying layer exposed form the gaps, a step of planarizing the insulating film, and a step of patterning the planarized insulating film by etching to thereby form the protection insulating film.

According to this aspect, the insulating film is formed over the substrate surface after the pixel electrodes are formed, is planarized, and is then patterned by etching, thereby forming the protection insulating film. Thus, the protection insulating film having the planarized surface can be formed at predetermined regions with high accuracy.

According to this aspect of the present invention, the etching may involve wet etching.

With this manufacturing method, the end surfaces of the protection insulating film having the planarized surface can be formed so as to have gentle slopes. In other words, the end surfaces can be formed to have taper portions with an appropriate taper angle, for example, 45° or less or 30° or less. The etching may be performed in only wet etching or may be performed in combination with wet etching and dry etching.

According to another aspect of the manufacturing method for the electro-optical device of the present invention, the step of forming the protection insulating film is performed below a predetermined temperature that does not damage at least one of the wires and the electronic elements.

According to this aspect, the protection insulating film is formed by, for example, CVD, sputtering, and etching below a predetermined temperature, for example, below 400° C. As a result, the various wires and electronic elements, such as the TFTs, storage capacitors, data lines, scan lines, which are already fabricated below the underlying layer, can reduce or prevent damage. That is, it is possible to reduce or prevent an event that diffusion occurs due to a high temperature in a semiconductor layer to change the property of the semiconductor layer or an event that a conductive film or insulating film is deformed due to thermal stress or is cracked. Specifically, the protection insulating film is formed by a so-called low-temperature process, such as low-temperature CVD and low-temperature sputtering.

To overcome the forgoing problems, an electronic apparatus of an aspect of the present invention includes the above-described electro-optical device of an aspect of the present invention (including various modifications thereof).

Since the electronic apparatus of an aspect of the present invention includes the electro-optical device of an aspect of the present invention, the electronic apparatus has reduced brightness irregularities and display irregularities. Thus, it is possible to achieve various electronic apparatuses that can display a high-quality image. Examples of such apparatuses include projection-type display apparatuses, liquid-crystal televisions, portable telephones, electronic organizers, word processors, viewfinder-type or monitor-direct-viewing-type videotape recorders, workstations, videophones, POS terminals, and touch panels. In addition, the electronic apparatus of an aspect of the present invention also can implement, for example, an electrophoresis apparatus for an electronic paper or the like.

These effects and other advantages of the present invention will be more apparent from the exemplary embodiments described below.

DETAILED DESCRIPTION OF PREFERRED EMBODIMENTS

Embodiments of the present invention will be described below with reference to the accompanying figures. An exemplary embodiment described below is directed to a case in which an electro-optical device of an aspect of the present invention is applied to a TFT active-matrix-drive system liquid crystal device.

Configuration of Pixel Portion

A pixel portion of an electro-optical device according to an exemplary embodiment of the present invention will be described with reference to FIGS. 1 to 7.

Figure 1:
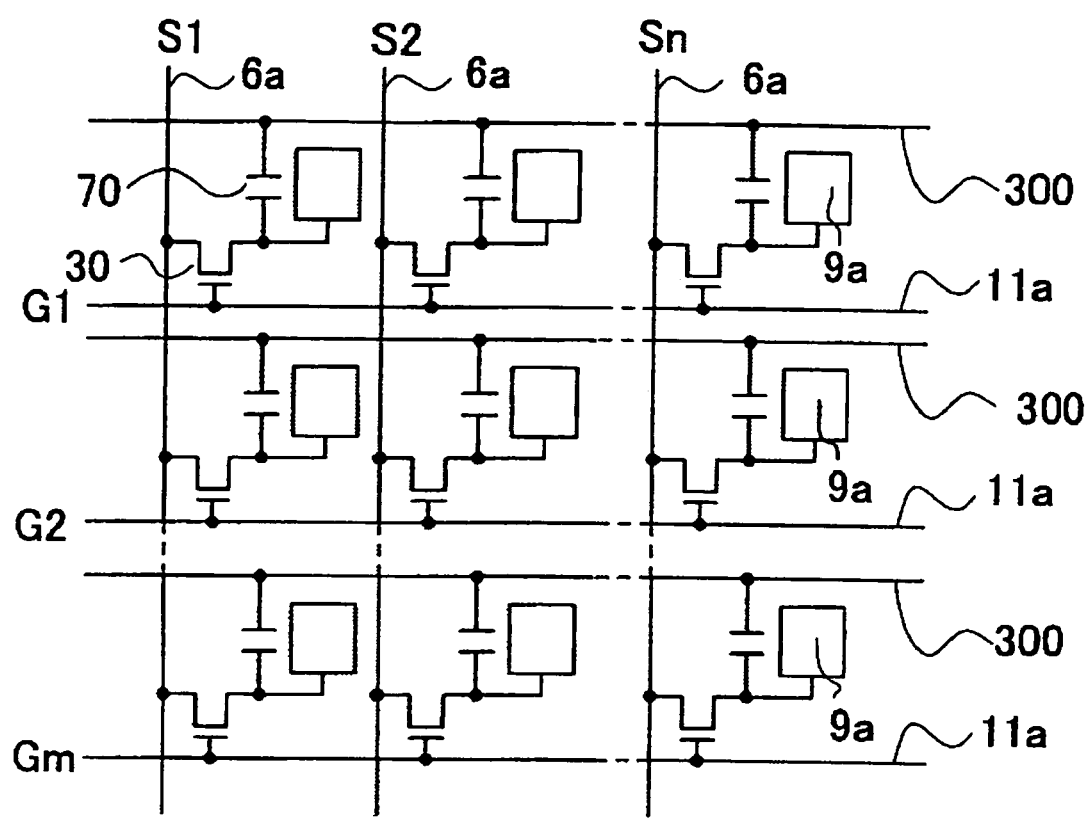
FIG. 1 is a circuit schematic showing an equivalent circuit of various elements, wires, and the like which are provided for a plurality of pixels that are formed in a matrix to constitute an image display area in an electro-optical device of an exemplary embodiment of the present invention.

First, the electrical-circuit configuration thereof will be described with reference to FIG. 1. FIG. 1 is an equivalent circuit of various elements, wires, and the like for a plurality of pixels that are formed in a matrix to constitute an image display area of an electro-optical device.

Referring to FIG. 1, the plurality of pixels, which are formed in a matrix to constitute the image display area of the electro-optical device of the present exemplary embodiment, have corresponding pixel electrodes 9a and TFTs 30 to control the switching of the pixel electrodes 9a. Data lines 6a, through which image signals are supplied, are electrically connected to the sources of the corresponding TFTs 30. Image signals S8, S2, . . . , and Sn to be written into the data lines 6a may be line-sequentially supplied-to the data lines 6a in that order or may be supplied to pluralities of adjacent data lines 6a group by group.

Gate electrodes are electrically connected to the gates of the corresponding TFTs 30 so as to line-sequentially supply scan signals G1, G2, . . . , and Gm to scan lines 11a and the gate electrodes in that order in a pulsed manner at a predetermined timing. The pixel electrodes 9a are electrically connected to the drains of the corresponding TFTs 30, and the switches of the TFTs 30, which serve as switching elements, are closed for a certain period of time, so that the image signals S1, S2, . . . , and Sn, which are supplied through the data lines 6a, are written into the pixel electrodes 9a at a predetermined timing.

The image signals S1, S2, . . . , and Sn, which are at predetermined levels and which are written into liquid crystal, which is one example of electro-optic material, via the pixel electrodes 9a, are held for a certain period of time between the pixel electrodes 9a and an opposing electrode formed on an opposing substrate. Liquid crystal allows modulation of light by varying the orientation and order of its molecular association in accordance with the level of an applied voltage, thereby allowing for gray scale display. For a normally white mode, a transmittance for incident light is reduced in accordance with an applied voltage for each pixel unit, and for a normally black mode, a transmittance for incident light is increased in accordance with an applied voltage for each pixel unit. The electro-optical device as a whole emits light rays having contrasts in accordance with image signals.

In this case, in order to reduce or prevent leakage of the held image signals, storage capacitors 70 are provided in parallel with liquid-crystal capacitances that are formed between the pixel electrodes 9a and the opposing electrode. The storage capacitors 70 are arranged alongside the scan lines 11a and include respective fixed-potential-side capacitance electrodes and capacitance electrodes 300 having a fixed potential.

Figure 2:
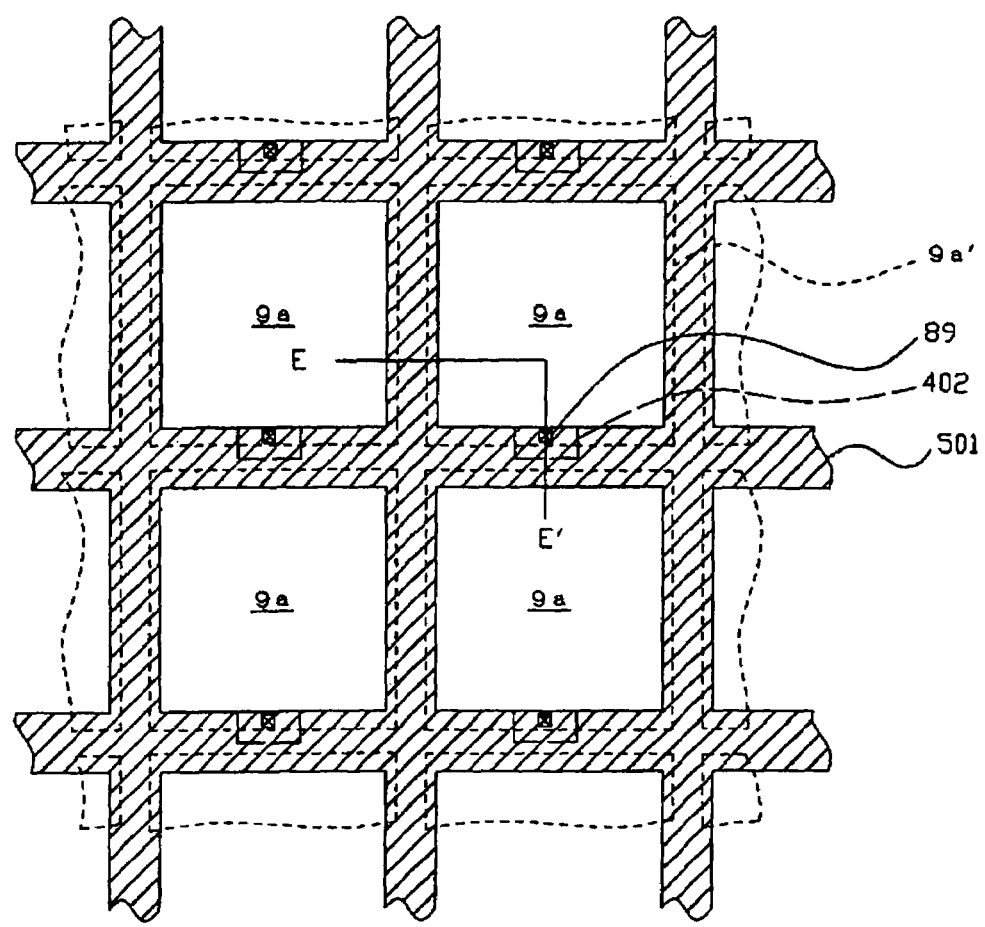
FIG. 2 is a plan view of a plurality of adjacent pixels above the TFT array substrate, particularly showing pixel electrodes, a protection insulating film, and the like according to an exemplary embodiment of the present invention.
Figure 3:
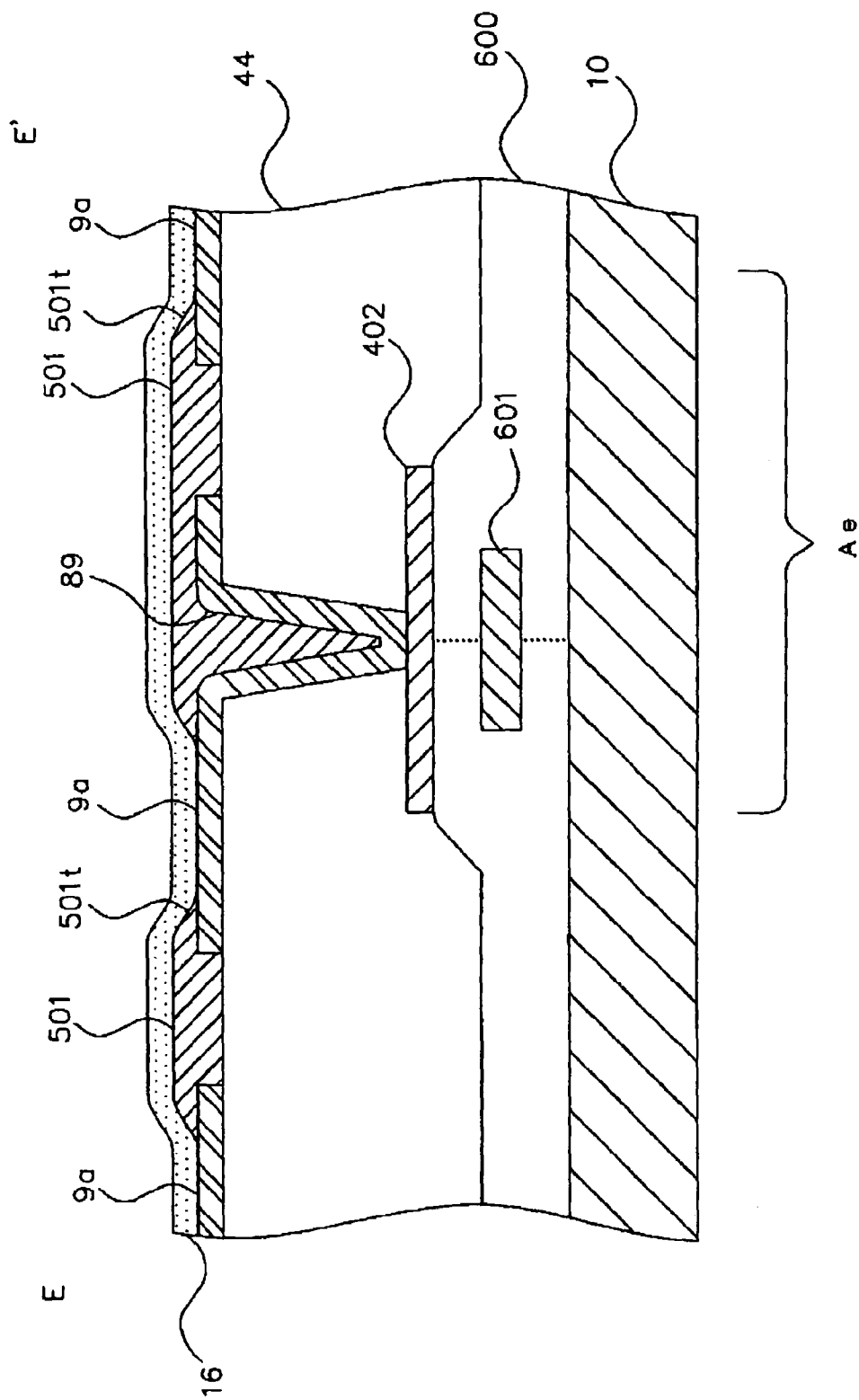
FIG. 3 is a sectional view along the plane E–E' shown in FIG. 2.

A configuration to prevent the generation and trapping of material residues of an alignment layer formed at the uppermost layer of the TFT array substrate in the pixel portion will now be described with reference to FIGS. 2 to 4. FIG. 2 is a plan view of a group of adjacent pixels above the TFT array substrate, showing particularly, pixel electrodes, a protection insulating film, relay electrodes, and contact holes in the present exemplary embodiment, which are provided above the TFT array substrate, to electrically connect the pixel electrodes with the relay electrodes. FIG. 3 is a sectional view taken along the plane E–E' shown in FIG. 2.

Figure 4:
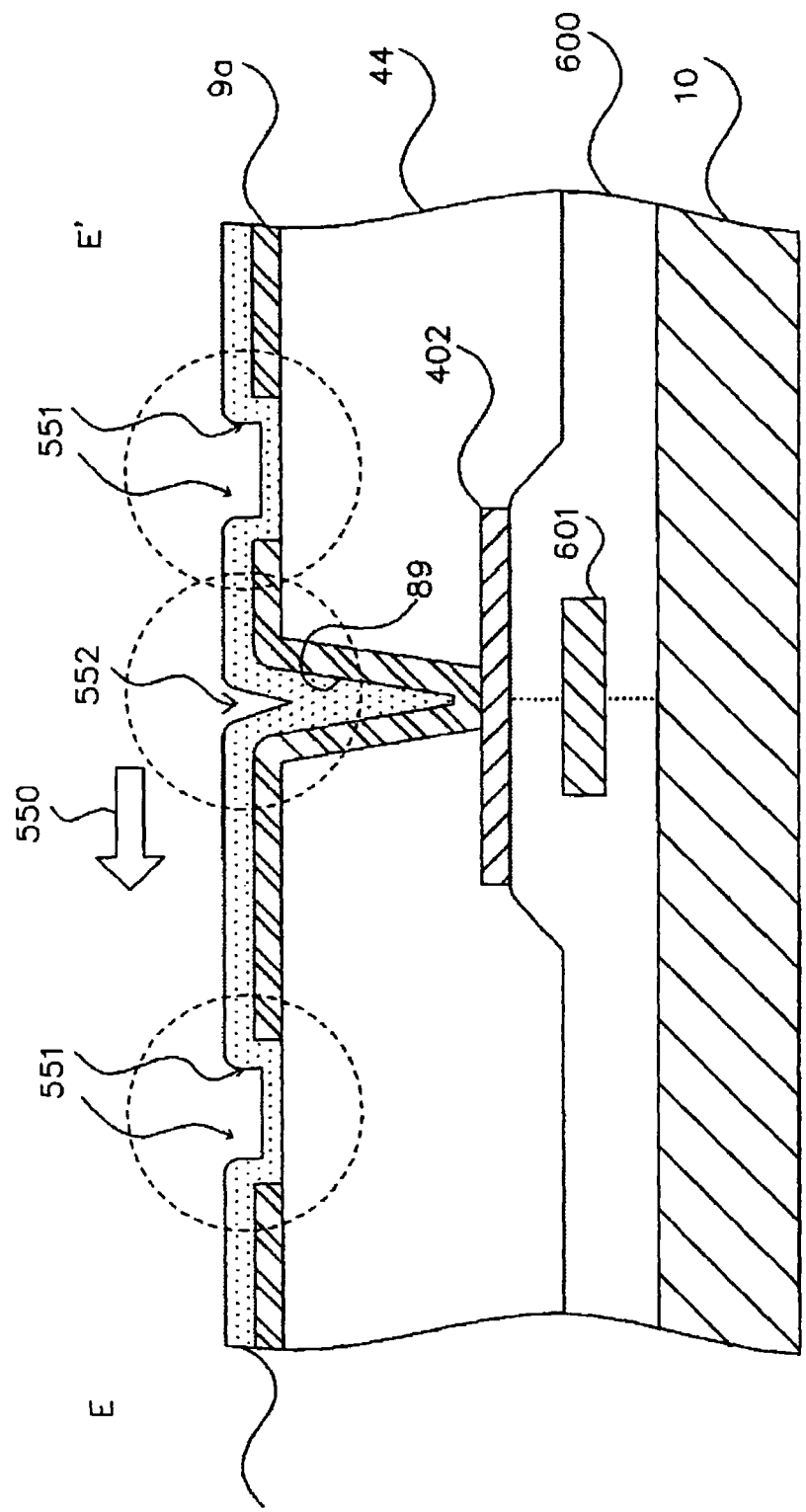
FIG. 4 is a sectional view of a portion of a comparative example corresponding to the section taken along the plane E–E' shown in FIG. 2.

FIG. 4 is a sectional view of a portion of a comparative example corresponding to the section taken along the plane E–E' shown in FIG. 2. In FIGS. 3 and 4, the scales are different for individual layers and members so that the layers and members can be recognized in the figures.

As shown in FIGS. 2 and 3, at the pixel portion, an alignment layer 16 is formed at the uppermost layer of a TFT array substrate 10, which is an active matrix substrate.

The alignment layer 16 is formed, for example, by depositing polyimide or the like, and then rubbing it in a predetermined rubbing direction. While the alignment layer 16 is not shown in FIG. 2, it is formed, as a transparent layer, above the entire TFT array substrate at the uppermost layer thereof.

As shown in FIG. 2, the pixel electrodes 9a are arranged in a plane matrix. Each pixel electrode 9a has a rectangular plane shape, as the contour thereof indicated by the dotted line 9a' shown in FIG. 2.

Each pixel electrode 9a is connected to a relay electrode 402 via a contact hole 89 provided in an interlayer insulating film 44, which is one example of an "underlying layer" according to an aspect of the present invention.

As will be described below, the relay electrode 402 is connected to various wires/electronic-elements 601 which are fabricated therebelow in a multilayer structure 600. A specific configuration of the various wires/electronic-elements 601 will be described below (with reference to FIGS. 5 and 7).

In the present exemplary embodiment, a protection insulating film 501 is particularly formed in a lattice plane region indicated by hatching in FIG. 2. As shown in FIG. 3, the protection insulating film 501 is deposited between the pixel electrodes 9a and the alignment layer 16. The protection insulating film 501 is provided, for example, by patterning a transparent insulating film containing silicon oxide, silicon nitride, or the like. The protection insulating film 501 is provided so as to cover end surfaces of the edge portions of the pixel electrodes 9a.

As shown in the comparative example shown in FIG. 4, a configuration in which the protection insulating film 501 is eliminated from the configuration of the present exemplary embodiment will now be discussed. In this comparative example, as indicated by dotted-line circles in the figure, in the vicinities of end surfaces of the pixel electrodes 9a, protrusions/depressions 551 are formed at the surface of the alignment layer 16 according to the protrusions/depressions of the surfaces of the pixel electrodes 9a and the interlayer insulating film 44. In addition, in the vicinities of the contact holes 89 of the pixel electrodes 9a, protrusions/depressions 552 are formed at the surface of the alignment layer 16 according protrusions/depressions of the surfaces of the pixel electrodes 9a. Thus, when the alignment layer 16 is rubbed in a rubbing direction 550 indicated by the arrow in the figure, material residues of the alignment layer 16 are produced and are trapped at the protrusions/depressions 551 in the vicinities of the end surfaces of pixel electrodes 9a and at the protrusions/depressions 552 in the vicinities of the contact holes 89. At the time of rubbing, the presence of such protrusions/depressions 551 and 552 causes the surface of the alignment layer 16 to partially peel off, which further facilitates the generation of material residues of the alignment layer 16 and/or the occurrence of rubbing failure. As a result, in the electro-optical device using the TFT array substrate 10 in the comparative example shown in FIG. 5, brightness irregularities and/or display irregularities occur. In addition, when a configuration in which electro-optic material, such as liquid crystal, is sandwiched using the TFT array substrate 10 as one substrate is employed, material residues generated in that manner are suspended in the electro-optic material, which could further increase the brightness irregularities and display irregularities.

In contrast, according to the present exemplary embodiment, as shown in FIGS. 2 and 3, the vicinities of the end surfaces of the pixel electrodes 9a and the vicinities of the contact holes 89 are covered by the protection insulating film 501. Furthermore, as will be described below in detail in connection with a manufacturing process, the upper surface of the interlayer insulating film 44 and the upper surface of the protection insulating film 501 are planarized by a CMP (chemical-mechanical polishing) process, etch-back process, spin-coating process, or the like. Additionally, in the vicinities of the edges of the protection insulating film 501, gentle tapered portions 501t are provided.

Thus, according to an aspect of the present invention, the presence of the protection insulating film 501 reduces the step heights at the surface of the alignment layer 16 in the vicinities of the edges of the pixel electrodes 9a. In the manufacture of the electro-optical device, therefore, it is possible to efficiently reduce the amount of material residues that are generated in the vicinities of edges of the pixel electrodes 9a during the rubbing process of the alignment layer 16. In addition, it is also possible to effectively reduce the possibility of or prevent an event that the edges of the pixel electrodes 9a and the alignment layer 16 provided thereon partially or microscopically peel off at the time of rubbing. As a result, material residues of the alignment layer 16, which are generated in conjunction with the peeling off, can also be reduced. Further, rubbing failure that occurs in conjunction with the peeling off can also be reduced consequently. In addition, for example, it is also possible to effectively reduce or prevent material residues generated in that manner from being suspended in the electro-optic material, such as liquid crystal.

Moreover, according to an aspect of the present invention, it is sufficient to form the protection insulating film 501 in the vicinities of the gaps between the pixel electrodes 9a, and there is no need to form the protection insulating film 501 at the center portions of the pixel electrodes 9a which occupy pixel aperture regions. Thus, the presence of the protection insulating film 501 reduces or prevents a burn-in phenomenon of a displayed image, which is significantly advantageous in practical use. In other words, the protection insulating film 501 is provided in regions where no pixel aperture regions are provided. Further, various built-in light-shielding films are provided in the regions where the protection insulating film 501 is provided (i.e., the hatched region in FIG. 2) above the TFT array substrate 10, as described below, and in place of or in addition to the built-in light-shielding films, a light-shielding film is provided above the opposing substrate.

In the present exemplary embodiment, the taper angle of the tapered portions 501t is preferably 45° or less at the edges of the protection insulating film 501, and is more preferably 30° or less. The provision of such gentle tapered portions 501 can significantly reduce the amount of generated or trapped material residues of the alignment layer 16 according to the gentleness of the steps having the tapered portions 501, even when the alignment layer 16 is formed and is rubbed. The taper angle, however, is not limited to the above-mentioned angular range. Thus, a taper angle that is even slightly gentle relative to the end surfaces of the pixel electrodes 9a can provide equivalent advantages. In addition, of the edge portions of the protection insulating film 501, the taper portions 501t are provided at portions extending in a direction that intersects the predetermined rubbing direction (see the arrow 550 in FIG. 4). Further, it is also possible that the tapered portions 501t are not provided at the other edge portions. Thus, the provision of the tapered portions 501t at the edge portions of the protection insulating film 501, which are rubbed up or rubbed down when the alignment layer 16 is rubbed, can efficiently reduce the amount of generated and trapped material residues of the alignment layer.

Figure 5:
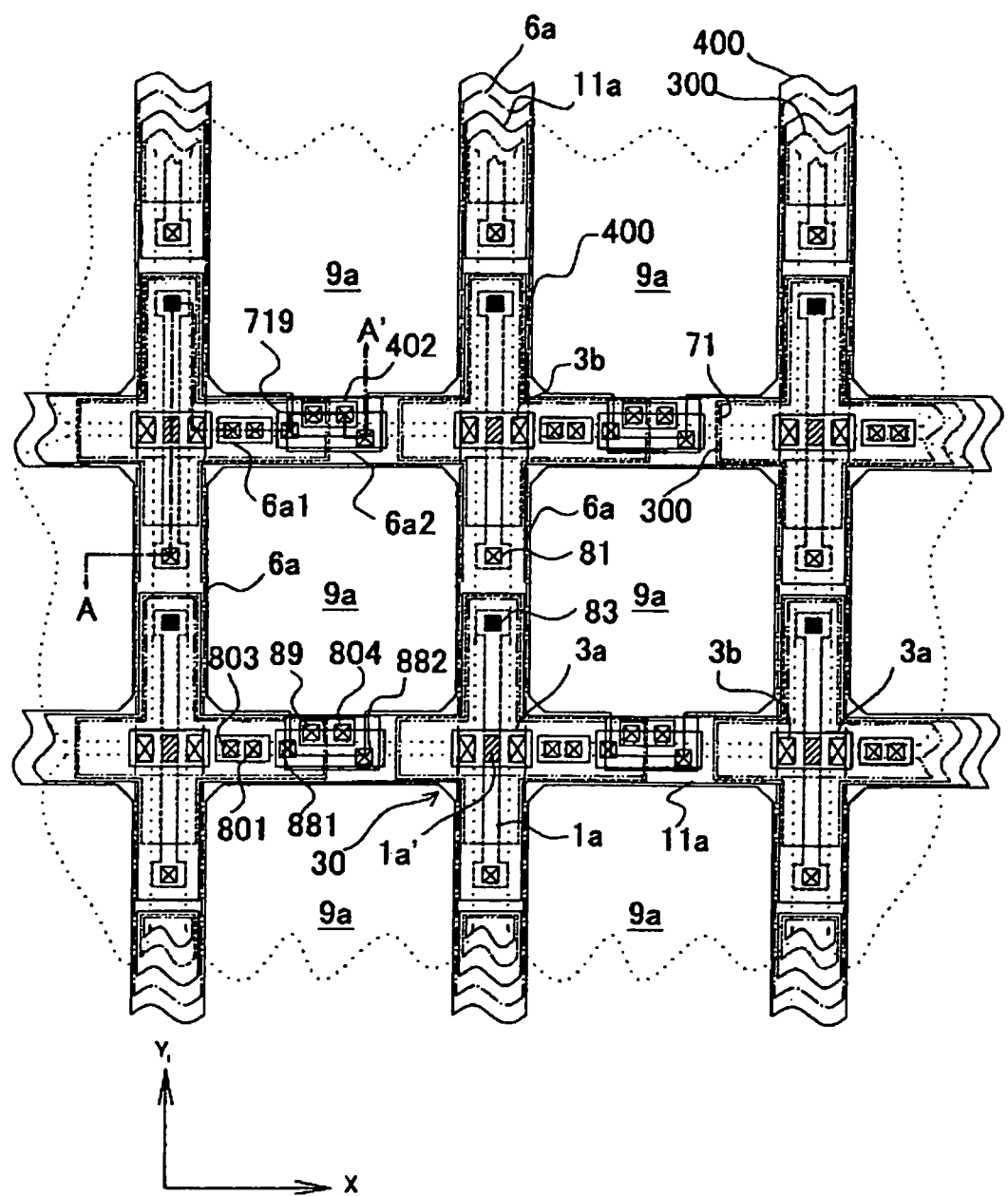
FIG. 5 is a plan view of a plurality of adjacent pixels above the TFT array substrate having the data lines, scan lines, pixel electrodes, and the like in the electro-optical device of an exemplary embodiment of the present invention.
Figure 6:
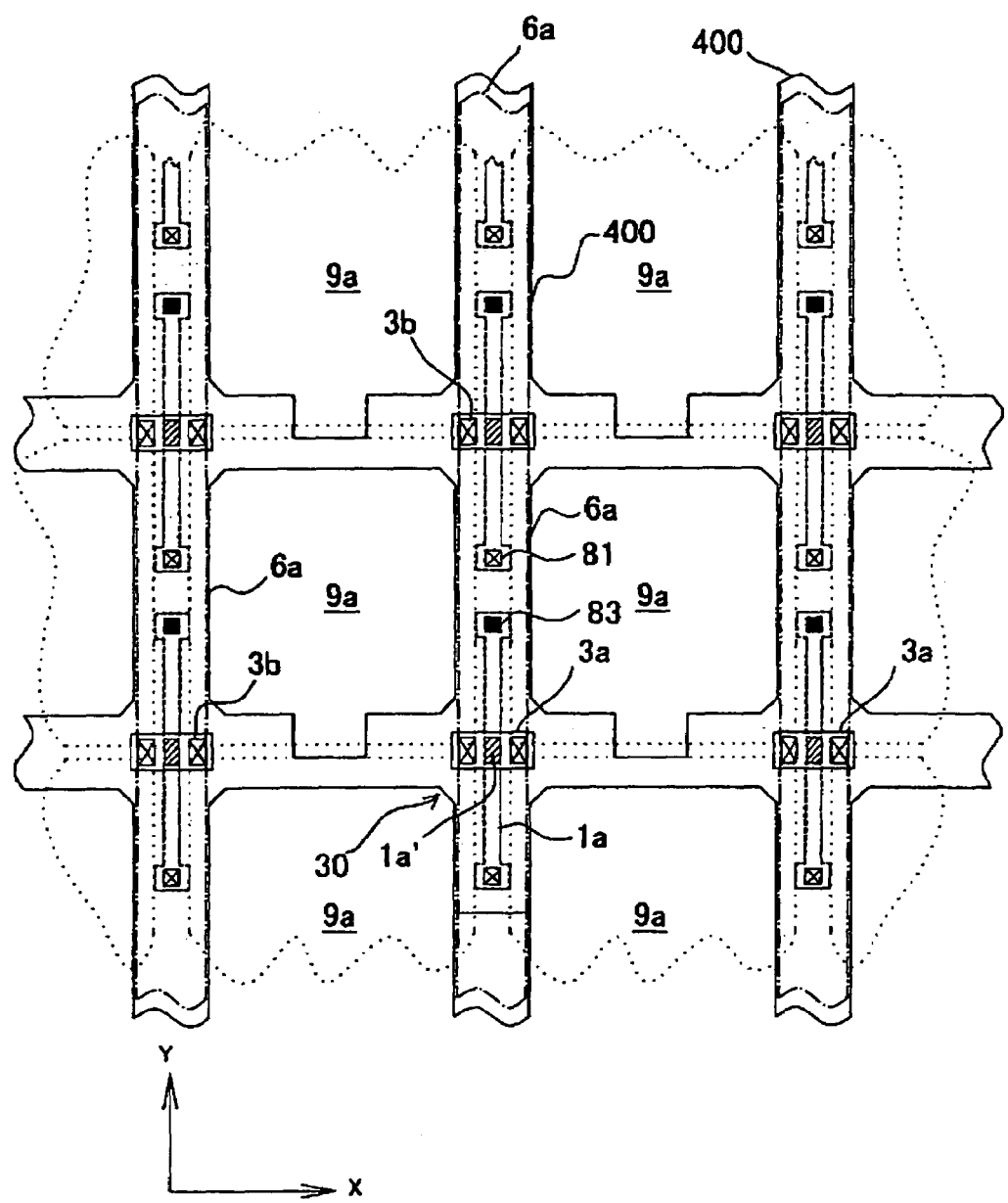
FIG. 6 is a plan view particularly showing only a major portion shown in FIG. 5.
Figure 7:
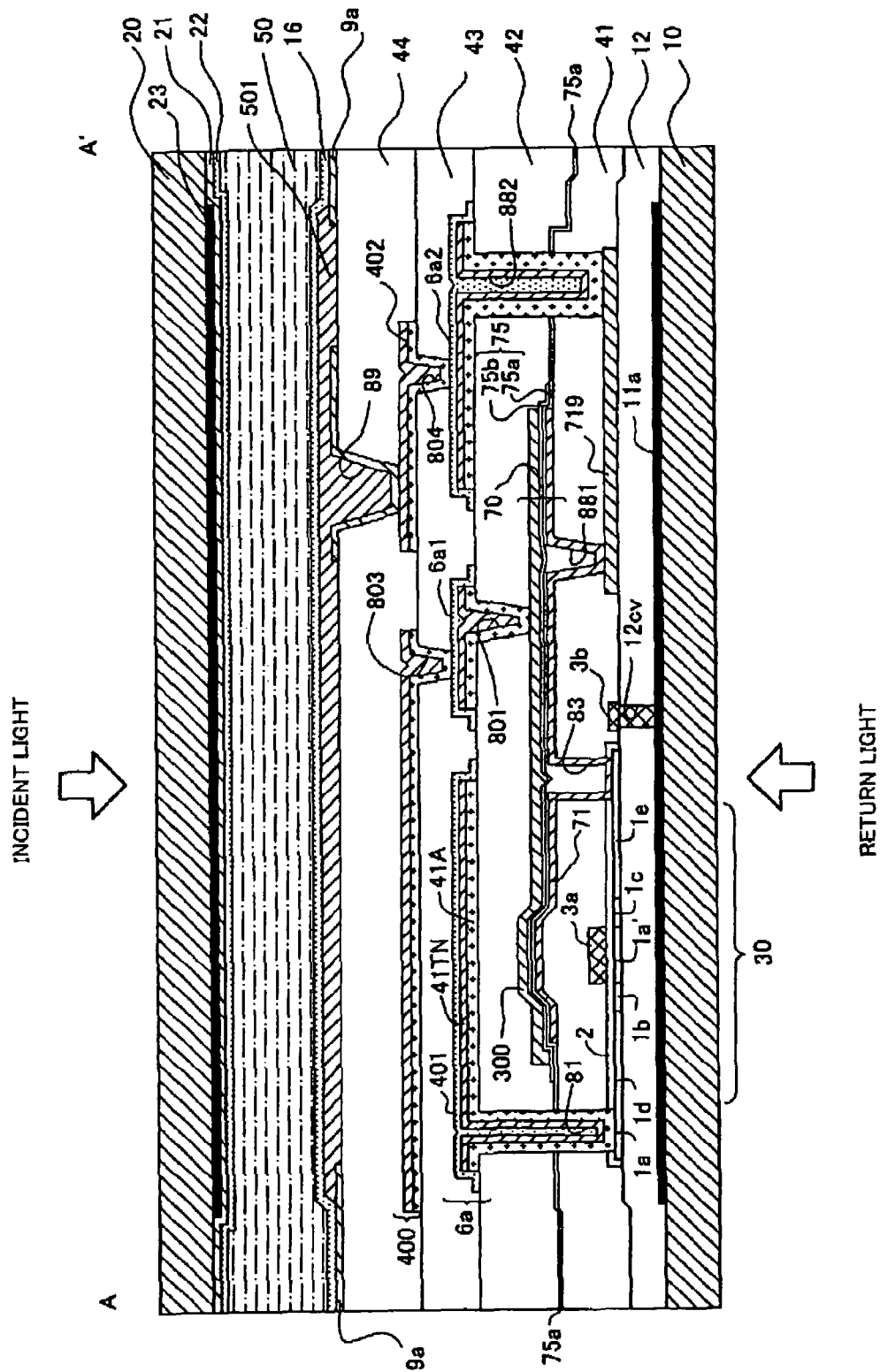
FIG. 7 is a sectional view along the plane A–A' shown in FIG. 5.

The actual configuration of the electro-optical device that realizes the operation of the above-described circuit, including the data lines 6a, the scan lines 11a, the gate electrodes, and the TFTs 30, will now be described with reference to FIGS. 5 to 7. FIG. 5 is a plan view of a plurality of adjacent pixels above the TFT array substrate having the data lines, scan lines, pixel electrodes, and the like. FIG. 6 is a plan view of a major portion of FIG. 5, specifically with, mainly, the data lines, a shield layer, and pixel electrodes being extracted, to illustrate the geometric relationship thereof. FIG. 7 is a sectional view along the plane A–A' shown in FIG. 5. In FIG. 7, the scales are made different for individual layers and members to allow them to have such sizes that can be recognized in the figure.

First, referring to FIG. 5, the plurality of pixel electrodes 9a (the contours thereof are represented by dotted lines) are arranged in a matrix above the TFT array substrate 10 and the data lines 6a and the scan lies 11a are provided along the vertical borders and the horizontal borders of the pixel electrodes 9a. The data lines 6a each have a multilayer structure containing an aluminum film and the like, as described below, and the scan lines 11a are made of, for example, conductive metal films or polysilicon films. The scan lines 11a are electrically connected to the gate electrodes 3a, which oppose channel regions 1a' indicated by regions of right-upward slanting lines in a semiconductor layer 1a in the figure. The scan lines 11a include the gate electrodes 3a. That is, the pixel switching TFTs 30, whose gate electrodes 3a included in the scan lines 11a are arranged so as to oppose the channel regions 1a', are provided at corresponding portions where the gate lines 3a and the data lines 6 intersect each other. In other words, the TFT 30s (excluding the gate electrodes) have a configuration in which they are positioned between the gate electrodes 3a and the corresponding san lines 11a.

Next, as shown in FIG. 7 which is a cross-sectional view along the plane A–A' of FIG. 5, the electro-optical device has the TFT array substrate 10, such as a quartz substrate, glass substrate, or silicon substrate, and an opposing substrate 20 that is opposite thereto, such as a glass substrate or quartz substrate.

As shown in FIG. 7, the pixel electrodes 9a are provided at the TFT array substrate 10 side, and the alignment layer 16, which has been subjected to a predetermined alignment process, such as a rubbing process, is provided above the pixel electrodes 9a. The pixel electrodes 9a are made of, for example, transparent conductive films such as an ITO films. On the other hand, an opposing electrode 21 is provided over an entire surface of the opposing substrate 20, and an alignment layer 22, which has been subjected to a predetermined alignment process, such as a rubbing process, is provided under the opposing electrode 21. In the same manner as the above-described pixel electrodes 9a, the opposing electrode 21 is made of, for example, a transparent conductive film, such as an ITO film, and the alignment layers 16 and 22 are made of, for example, transparent organic films such as polyimide films.

As shown in FIG. 7, on the opposing substrate 20, light-shielding films 23 are formed in a lattice pattern or a striped pattern in regions other than the regions where the pixel aperture regions are provided. With this configuration, the built-in light-shielding films including the data lines 6a, the capacitance electrodes 300, and the like which are fabricated at the TFT array substrate 10 side, as described below, together with the light-shielding films 23, provide light-shielding effects. This can more reliably reduce or prevent incident light from the opposing substrate 20 side from entering the channel regions 1a' and their adjacent regions. In addition, each light-shielding film 23 may be configured such that at least a surface thereof to be irradiated with incident light is formed of a high-reflectivity film so as to act to reduce or prevent an increase in the temperature of the electro-optical device. The light-shielding film 23 is preferably formed so as to be positioned within the light-shielding region of the corresponding built-in light-shielding film at the TFT array substrate 10 side in plan view, i.e., so as to be slightly smaller than the built-in light-shielding film. By doing so, the light-shielding film 23 can provide advantages of shielding light and reducing or preventing a temperature increase without reducing the aperture ratio of each pixel.

Between the TFT array substrate 10 and the opposing substrate 20, which are arranged so as to oppose each other as described above, electro-optic material, such as liquid crystal, is injected into a space surrounded by a sealant (see FIGS. 10 and 11) described below to thereby form a liquid-crystal layer 50. In a state in which no electric field from the pixel electrodes 9a is applied to the liquid crystal layer 50, the alignment layers 16 and 22 cause the liquid crystal layer 50 to be in a predetermined alignment state. The liquid crystal layer 50 is made of electro-optic material containing, for example, one or more types of nematic liquid crystal. The sealant is an adhesive, which is made of a photo curable resin, thermosetting resin, or the like, to laminate the TFT substrate 10 and the opposing substrate 20 at the peripheries thereof. Spacers, such as glass fibers or glass beads, are mixed into the sealant so as to keep the distance between the substrates at a predetermined value.

On the other hand, various elements, including the pixel electrodes 9a and the alignment layer 16, are provided as a multilayer structure above the TFT array substrate 10. As shown in FIG. 7, this multilayer structure includes, sequentially from the bottom, a first layer including the scan lines 11a, a second layer including the TFTs 30 and the like having the gate electrodes 3a, a third layer including the storage capacitors 70, a fourth layer including the data lines 6a and the like, a fifth layer including shield layers 400 and the like, and a sixth layer (the uppermost layer) including the pixel electrodes 9a, the alignment layer 16, and the like. Further, an underlying insulating film 12 is provided between the first and second layers, a first interlayer insulating film 41 is provided between the second and third layers, a second interlayer insulating film 42 is provided between the third and fourth layers, a third interlayer insulating film 43 is provided between the fourth and fifth layers, and a fourth interlayer insulating film 44 is provided between the fifth and sixth layers. These insulating films 12, 41, 42, 43, and 44 serve to reduce or prevent short-circuiting between the above-described elements. These various insulating films 12, 41, 42, 43, and 44 are also provided with contact holes and the like to provide electrical connections between the data lines 6a and the heavily-doped source regions 1d in the semiconductor layers 1a of the TFTs 30. In the below, these individual elements will be described sequentially from the bottom.

First, the first layer includes the scan lines 11a, which are made of, for example, a single metal, metal alloy, metal silicide, or polysilicide which includes at least one of high-melting-point metals, such as Ti, (titanium), Cr (chromium), W(tungsten), Ta (tantalum), and Mo (molybdenum); a stack thereof; or conductive polysilicon. The scan lines 11a are patterned in a stripe along the X direction in FIG. 5 in plan view. More specifically, the striped scan lines 11a have main-line portions extending along the X direction in FIG. 5 and protruding portions extending along the Y direction in which the data lines 6a or the shield layers 400 extend in FIG. 5. The protruding portions extending from the adjacent scan lines 11a are not connected with each other, and thus the scan lines 11a are separated one from another.

As a result, the scan lines 11a serve to simultaneously control the ON/OFF of the TFTs 30 that are provided in the same row. Since the scan lines 11a are formed so as to substantially bury the regions where the pixel electrodes 9a are not formed, the scan lines 11a also serve to shield light that is to enter the TFTs 30 from the bottom. This can suppress the generation of photo leakage current in the semiconductor layers 1a of the TFTs 30, thereby making it possible to display a high-quality image without flicker or the like.

Next, as the second layer, the TFTs 30 having the gate electrodes 3a are provided. As shown in FIG. 7, each TFT 30 has an LDD (lightly doped drain) structure. Elements that constitute the TFT 30 includes the gate electrode 3a, the channel region 1a' of the semiconductor layer 1a, and an insulating film 2 including a gate insulating film to insulate the gate electrode 3a and the semiconductor layer 1a, as well as a lightly-doped source region 1b, a lightly-doped drain region 1c, a heavily-doped source region 1d, and a heavily-doped drain region 1e in the semiconductor layer 1a. The channel region 1a' is made of, for example, a polysilicon film, and a channel therein is formed by an electric field from the gate electrode 3a.

In the present exemplary embodiment, particularly, a relay electrode 719 is formed in the second layer as the same film as the gate electrode 3a. The relay electrode 719 is formed in an island pattern so as to be positioned at substantially the center of one edge of each pixel electrode 9a, as shown in FIG. 5, in plan view. Since the relay electrode 719 and the gate electrode 3a are formed as the same film, for example, when the latter is made of a conductive polysilicon film or the like, the former is also made of the conductive polysilicon film or the like.

Each TFT 30 described above preferably has an LDD structure as shown in FIG. 7. The TFT 30, however, may have an offset structure in which no impurity ions are implanted into the lightly-doped source region 1b and the-lightly-doped drain region 1c or may have a self-aligned TFT in which impurity ions are implanted using a gate electrode 3a as a mask and heavily-doped source and drain regions are formed in a self-aligned manner. In addition, the present exemplary embodiment has a single-gate structure in which only one gate electrode of the pixel-switching TFT 30 is arranged between the heavily-doped source region 1d and the heavily-doped drain region 1e. Two or more gate electrodes, however, may also be arranged between those regions. Configuring the TFT with the dual, triple, or more gates can reduce or prevent leakage current at the junction among the channel, source, and drain regions, and thus can reduce electrical current in the OFF state.

Further, the semiconductor layer 1a included in the TFT 30 may be or may not be a single-crystal layer. A known method, such as a laminating method, can be used for the formation of the single-crystal layer. Forming the semiconductor layer 1a with a single-crystal layer can enhance the performance of, especially, the peripheral circuits.

The underlying insulating film 12, which is made of a silicon oxide film or the like, is provided on the scan line 11a described above and below the TFT 30. The underlying insulating film 12 serves to provide interlayer insulation between the scan line 11a and the TFT 30. In addition, since the underlying insulating film 12 is formed over an entire surface of the TFT array substrate 10, the underlying insulating film 12 serves to reduce or prevent the surface of the TFT array substrate 10 from becoming rough at the time of the surface polishing and to reduce or prevent a characteristic change in the pixel switching TFT 30 because of stain or the like that remains after cleaning.

In the underlying insulating film 12, grooves 12cv are provided at two sides of the semiconductor layer 1a in plan view to extend along the corresponding data line 6a described below. The gate electrode 3a that is deposited above the grooves 12cv so as to correspond thereto includes a portion having a depression at the bottom side. Further, the gate electrode 3a is formed so as to bury the entire grooves 12cv, and side-wall portions 3b are integrally formed with the gate electrode 3a so as to extend thereto. As a result, the semiconductor layer 1a of the TFT 30 is covered from the sides when viewed in plan, as is clearly shown in FIG. 5, so that the entrance of light from at least that portion can be suppressed.

The side-wall portions 3b are formed to bury the grooves 12cv and the lower ends of the grooves 12cv are designed so as to be in contact with the corresponding scan line 11a. Since the scan lines 11a are formed in a striped pattern as described above, the gate electrodes 3a and the scan line 11a, which are present in one row, are always at the same potential as long as that line is concerned.

An aspect of the present invention may employ a structure in which other scan lines including the gate electrodes 3a are arranged in parallel to the scan lines 11a. In such a case, the scan lines 11a and the other scan lines take a redundant wiring structure.

As a result, for example, when part of the scan lines 11a has some defect to make a normal electrical conductivity impossible, as long as another scan line that is present in the same row as the defective scan line 11a is sound, the operation of the TFTs 30 can still be controlled via the sound scan line in a normal manner.

Meanwhile, the storage capacitors 70 are provided in the third layer subsequent to the second layer. Each storage capacitor 70 is formed in such a manner that a lower electrode 71, which serves as a pixel-potential-side capacitance electrode connected to the heavily-doped drain region 1e of the TFT 30 and the pixel electrode 9a, and the capacitance electrode 300, which serves as a fixed-potential-side capacitance electrode, are arranged so as to oppose each other with a dielectric film 75 interposed therebetween. The storage capacitor 70 makes it possible to significantly increase the potential retention characteristic of the pixel electrode 9a. As is seem from the plan view of FIG. 5, the storage capacitor 70 according to the present exemplary embodiment is formed so as not to reach light transmitting regions that substantially correspond to the regions where the pixel electrodes 9a are formed (in other words, is formed so as to fit in a light-shielding region). Thus, the aperture ratio of the pixels of the entire electro-optical device is maintained to be relatively large, which thereby makes it possible to display a brighter image.

More specifically, the lower electrode 71 is made of, for example, a conductive polysilicon film, and serves as a pixel-potential-side capacitance electrode. The lower electrode 71, however, may be formed of a single layer film or multilayer film containing metal or a metal alloy. The lower electrode 71 not only serves as a pixel-potential-side capacitance electrode and also serves to relay and connect the pixel electrode 9a and the heavily-doped drain region 1e of the TFT 30.

Each capacitance electrode 300 serves as a fixed-potential-side capacitance electrode of the storage capacitor 70. In the present exemplary embodiment, in order to fix the potential of the capacitance electrode 300, it is electrically connected to the corresponding shield layer 400 that has a fixed potential.

As shown in FIG. 7, each dielectric film 75 has, for example, a relatively-thin thickness, namely, about 5 to 200 nm, and is configured with a silicon oxide film, such as an HTO (high temperature oxide) film or an LTO (low temperature oxide) film, or a silicon nitride film. In terms of increasing the capacitance of the storage capacitor 70, it is more desirable as the thickness of the dielectric film 75 increases, as long as sufficient film reliability can be provided. In the present exemplary embodiment, particularly, the dielectric film 75 has a two-layer structure with a silicon oxide film 75a at the lower layer and a silicon nitride film 75b at the upper layer, as shown in FIG. 7. Thus, the presence of the silicon nitride film 75b, which has a relatively large dielectric constant, can increase the capacitance of the storage capacitor 70. In addition, despite the capacitance increase, the presence of the silicon oxide film 75a can reduce or prevent a decrease in the voltage resistance of the storage capacitor 70. In this manner, the two-layer structure of the dielectric film 75 can provide mutually-contradictory two advantages. The presence of the silicon nitride film 75b can also reduce or prevent water penetration into the TFT 30. This exemplary embodiment, therefore, can keep the device in service for a relatively long period without incurring an event that the threshold voltage of the TFT 30 increases. Although the dielectric film 75 has the two-layer structure in the present exemplary embodiment, it may have a three-layer structure having, for example, a silicon oxide film, a silicon nitride film, and a silicon oxide film, or may have a structure with four or more layers.

The first interlayer insulating film 41 is formed on the relay electrodes 719 and the above-described TFTs 30, or the gate electrodes 3a, and under the storage capacitors 70. The first interlayer insulating film 41 is configured with a silicate glass film, silicon nitride film, silicon oxide film, or the like. Examples of silicate glass include NSG (non-silicate glass), PSG (phosphorous silicate glass), BSG (boron-silicate glass), and BPSG (boron-phosphorous silicate glass). The first interlayer insulating film 41 is preferably formed of NSG. Contact holes 81, which provide electrical connection between the heavily-doped regions 1d of the TFTs 30 and the data lines 6a described below, are provided in the first interlayer insulating film 41, so as to penetrate the second interlayer insulating film 42 described below. Further, contact holes 83, which provide electrical connection between the heavily-doped drain regions 1e of the TFTs 30 and the lower electrodes 71 included in the storage capacitors 70, are provided in the first interlayer insulating film 41.

Contact holes 881 are further provided in the first interlayer insulating film 41 to provide electrical connection between the relay electrodes 719 and the lower electrodes 71, which are included in the storage capacitors 70 to serve as pixel-potential-side capacitance electrodes. In addition, contact holes 882, which provide electrical connection between the relay electrodes 719 and second relay electrodes 6a2 described below, are provided in the first interlayer insulating film 41, so as to penetrate the second interlayer insulating film 42 described below.

Of the four types of contact holes, the dielectric films 75 are not formed at portions where the contact holes 81 and 82 are formed, i.e., openings are formed thereat in the dielectric films 75. This is because the contact holes 81 need to provide electrical connection between the heavily-doped regions 1b and the data lines 6a via the lower electrodes 71 and the contact holes 882 need to penetrate the first and second interlayer insulating films 41 and 42. In this connection, when the semiconductor layers 1a of the TFTs 30 are hydrotreated, the provision of such openings in the dielectric films 75 can provide an advantage in that hydrogen used for the treatment can easily reach the semiconductor layers 1a via the openings.

Further, in the present exemplary embodiment, the first interlayer insulating film 41 may be fired at about 1000° C. to activate ions implanted into the polysilicon films constituting the semiconductor layers 1a and the gate electrodes 3a.

The data lines 6a are also provided in the fourth layer subsequent to the third layer. The data lines 6a are formed in a striped pattern so as to match the direction in which the semiconductor layers 1a of the TFTs 30 extend, i.e., so as to match the Y direction in FIG. 5. As shown in FIG. 7, each data line 6a is formed as a film having a two-layer structure with the lower layer being made of aluminum and the upper layer being made of titanium nitride (see reference numeral 401 in FIG. 7). Since the data line 6a contains aluminum which is a low-resistance material, it is possible to smoothly supply image signals to the TFTs 30 and the pixel electrodes 9a. On the other hand, since the data line 6a contains titanium nitride that is relatively superior in the effect of shutting off water penetration, it is possible to enhance the moisture resistance of the TFTs 30 and also to extend the life thereof.

Further, in the fourth layer, shield-layer relay layers 6a1 and the second relay electrodes 6a2 are formed as the same layers as the data lines 6a. When viewed in plan, the shield-layer relay layers 6a1 and the second relay electrodes 6a2 are pattered, as shown in FIG. 5, so as to be separate from each other rather than being formed to have a planar shape continuing to the data lines 6a in plan view. That is, when attention is paid to the data line 6a located at the leftmost in FIG. 5, the shield-layer relay layer 6a1 having a substantially rectangular shape is formed immediately to the right of the data line 6a and the second relay electrode 6a2 having a substantially rectangular shape with an area slightly larger than the shield-layer relay layer 6a1 is formed at the further right side thereof.

The second interlayer insulating film 42 is formed over the storage capacitor 70 and below the data line 6a, which are described above, with, for example, a silicon nitride film, a silicon oxide film, or a silicate glass film containing NSG, PSG, BSG, BPSG, or the like. Preferably, the second interlay insulating film 42 is formed by plasma CVD using a TEOS gas. In the second interlayer insulating film 42, the contact holes 81 that provide electrical connection between the heavily-doped source regions 1d of the TFTs 30 and the data lines 6a, and the contact holes 801 that provide electrical connection between the shield-layer relay layers 6a1 and the capacitance electrodes 300, which are the upper electrodes of the storage capacitors 70, are provided. Further, in the second-interlayer insulating film 42, the contact holes 882 that provide electrical connection between the second relay electrodes 6a2 and the relay electrodes 719 are formed.

Meanwhile, the shield layers 400 are provided in the fifth layer subsequent to the fourth layer. As shown in FIGS. 5 and 6, the shield layers 400 are formed in a lattice pattern so as to extend in the X and Y directions in plan view. Of the shield layers 400, portions extending in the Y direction in the figures are formed so as to cover the data lines 6a and so as to have a greater width than the data lines 6a. Portions extending in the X direction each have a notch in the vicinity of the center of one edge of each pixel electrode 9a to secure a region to form the third relay electrode 402, which will be described below.

Additionally, in FIGS. 5 and 6, at the corner portions at the intersections of the shield layers 400 extending in the X and Y directions, substantially-triangular portions are provided so as to fill the corners. The substantially-triangular portions provided at the shield layers 400 can effectively shield the semiconductor layers 1a of the TFTs 30 against light. That is, light entering the semiconductor layers 1a obliquely from above is reflected or absorbed by the triangular portions, and thus does not reach the semiconductor layers 1a. This suppresses the generation of photo leakage current, thus making it possible to display a high-quality image without flicker or the like.

The shield layers 400 extend from the image display area 10a, where the pixel electrodes 9a are arranged, to the peripheries thereof, and are electrically connected to a constant potential source to be at a constant potential. The "constant potential source" herein referred to may be a positive or negative constant potential source to be supplied to a data-line drive circuit 101 or may be a constant potential source to be supplied to the opposing electrode 21 of the opposing substrate 20.

In this manner, the presence of the shield layers 400 that are formed to cover the entire data lines 6a (see FIG. 6) and that are at a constant potential makes it possible to eliminate the influence of the capacitive coupling between the data lines 6a and the corresponding pixel electrodes 9a. That is, this arrangement can reduce or prevent an event that the potential of the pixel electrodes 9a varies in response to the passage of electrical current through the data lines 6a and can reduce the possibility that display irregularities and the like occur on an image along the data lines 6a. In the present exemplary embodiment, in particular, since the shield layers 400 are formed in a lattice, the present exemplary embodiment can restrain unwanted coupling from occurring at portions where the scan lines 11a extend.

In the fourth layer, the third relay electrodes 402, which are one example of the "relay layers" in an aspect of the present invention, are formed in the same films as the shield layers 400. Each third relay electrode 402 serves to relay an electrical connection between the second relay electrode 6a2 and the pixel electrode 9a via the contact hole 89 described below. The shield layer 400 and the third relay electrode 402 are formed so as not to continue to each other in plan view, but are patterned so as to be separate from each other.

Also, the shield layers 400 and the third relay electrodes 402 each have a two-layer structure with the lower layer being made of aluminum and the upper layer being made of titanium nitride. With this structure, it is expected that the titanium nitride provides a water-proof effect. Further, in the third relay electrode 402, the lower layer that is made of aluminum is connected to the corresponding second relay electrode 6a2 and the upper layer that is made of titanium nitride is connected to the corresponding pixel electrode 9a, which is made of ITO or the like. In this case, particularly, the layer will be connected in a satisfactory manner. In this case, if a configuration in which the aluminum and the ITO are directly connected is employed, electrolytic corrosion occurs therebetween. This causes aluminum breakage, insulation due to alumina formation, or the like, which is unfavorable since a preferable electrical connection is not achieved. As described above, the present exemplary embodiment can achieve a favorable electrical connection between the third relay electrodes 402 and the pixel electrodes 9a, which thereby makes it possible to maintain a favorable voltage application to the pixel electrodes 9a and a favorable potential retention characteristic of the pixel electrodes 9a.

In addition, the shield layers 400 and the third relay electrodes 402 can serve as light-shielding layers, since they contain aluminum that exhibits a relatively superior light-reflection property and also contain titanium nitride that exhibits a relatively superior light-absorption property. That is, according to this structure, the penetration of incident light (see FIG. 7) into the semiconductor layers 1a of the TFTs 30 can be reduced or prevented at the upper side thereof. The same thing can also hold true for the above-described capacitance electrodes 300 and the data lines 6a, as described above. In the present exemplary embodiment, the shield layers 400, the third relay electrodes 402, the capacitance electrodes 300, and the data lines 6a can serve as upper light-shielding films that shield incident light entering the TFTs 30 from the top while constituting part of the multilayer structures fabricated above the TFT array substrate 10 (or when attention is given to a point they constitute "part of the multilayer structures", they can serve as "built-in light-shielding films"). According to the concept of the "upper light-shielding films" or the "built-in light-shielding films", as well as the above-described configuration, it is also possible to regard the gate electrodes 3a, the lower electrodes 71, and the like as being included therein. In short, under a premise in the broadest sense, any configuration that is made of transparent material and that is provided above the TFT array substrate 10 can be called an "upper light-shielding film" or a "built-in light-shielding film".

The third interlayer insulating film 43 is formed over the data lines 6a and below the shield layers 400, with a silicate glass film, such as NSG, PSG, BSG, BPSG, silicon nitride film, silicon oxide film, or the like. Preferably, the third interlay insulating film 43 is formed by plasma CVD using a TEOS gas. The third interlayer insulating film 43 includes contact holes 803 to provide electrical connection between the shield layers 400 and the shield-layer relay layers 6a1, and contact holes 804 to provide electrical connection between the third relay electrodes 402 and the second relay electrodes 6a2.

With respect to the second interlayer insulating film 42, the above-described firing performed on the first interlayer insulating film 41 is not performed, so as to release stress generated in the vicinities of the capacitance electrodes 300.

Lastly, in the sixth layer, the above-described pixel electrodes 9a are formed in a matrix and the alignment layer 16 is formed on the pixel electrodes 9a. Below the pixel electrodes 9a, the fourth interlayer insulating film 44 made of a silicate glass film containing NSG, PSG, BSG, or BPSG, a silicon nitride film, a silicon oxide film, or the like is formed. Preferably, the fourth interlay insulating film 44 is formed of BPSG. In the fourth interlayer insulating film 44, the contact holes 89 to provide electrical connection between the pixel electrodes 9a and the third relay electrodes 402 are provided. In the present exemplary embodiment, particularly, the surface of the fourth interlayer insulating film 44 is planarized by a CMP (chemical mechanical polishing) process or the like to reduce alignment failure of the liquid-crystal layer 50 which is caused by steps due to the various wires, elements, and the like that are provided below the fourth interlayer insulating film 44. In place of or in addition to such planarization of the fourth interlayer insulating film 44, grooves may be provided in at least one of the TFT array substrate 10, the underlying insulating film 12, the first interlayer insulating film 41, the second interlayer insulating film 42, and the third interlayer insulating film 43 so as to bury, for example, wires, such as the data lines 6a, and the TFTs 30, and then the planarization may be performed.

In the above description, although each storage capacitor 70 has the three-layer structure having the pixel-potential-side capacitance electrode, the dielectric film and the fixed-potential-side capacitance electrode sequentially from the bottom, the storage capacitor 70 may have a structure reversed therefrom, as the case may be. In such a case, for example, it is desirable that the pixel-potential-side capacitance electrode, which is the upper electrode, be formed so as to have an area larger than the area of the fixed-potential-side capacitance electrode, i.e., the former have an excess surface area relative to the latter in plan view, and the excess surface area be arranged so as to correspond to the formation position of the contact hole communicating with the relay electrode 719. According to this structure, the electrical connection between the relay electrode 719 and the pixel-potential-side capacitance electrode is easily achieved through the contact hole. In this manner, the "pixel-potential-side capacitance electrode" referred to in an aspect of the present invention not only constitutes the "lower" electrode 71 of the storage capacitor 70 (refer to the above-described exemplary embodiment), but also may constitute the upper electrode thereof.

In the present exemplary embodiment, particularly, the protection insulating film 501, which has been detailed with reference to FIGS. 2 to 4, is formed between the pixel electrode 9a and the alignment layer 16, as shown in FIG. 7. While the layout in plan view of the protection insulating film 501 is shown in FIG. 2, the protection insulating film 501 is not shown in FIGS. 5 and 6 for the convenience of illustration.

Thus, the electro-optical device of the present exemplary embodiment can reduce impurities, such as material residues of the alignment layer 16, in the vicinities of the pixel electrodes 9a, thereby also reducing impurities suspended in the liquid-crystal layer 50. It is therefore possible to display a high-quality image with reduced brightness irregularities or display irregularities. In particular, even when the pixel pitch is reduced to thereby cause steps at end surfaces of the pixel electrodes 9a or depressions or the like due to the contact holes 89 to become relatively large or to thereby cause the size of material residues of the alignment layer 16 to become relatively large, the electro-optical device of an aspect of the present invention can efficiently reduce adverse effects caused by those factors. As a result, the electro-optical device of the present exemplary embodiment is significantly advantageous in displaying a higher-definition image.

In addition, according to the electro-optical device of an aspect of the present embodiment, the upper surface of the fourth interlayer insulating film 44 is planarized by a CMP process or the like. Thus, regardless of the presence of the various wires/electronic-elements fabricated in the layers below the fourth interlayer insulating film 44, the flatness of the entire surface of the alignment layer 16 which is in contact with the liquid-crystal layer 50 can be enhanced or the protrusion/depression shape of the surface of the alignment layer 16 which is in contact with the liquid-crystal layer 50 can be controlled into a desired shape with high accuracy because of the presence of the protection insulating film 501. As a result, alignment failure of the liquid crystal is reduced.

For example, in the electro-optical device of an aspect of the present embodiment, the liquid crystal is driven by the above-noted 1H inversion driving. In this case, more specifically, for example, the pixel electrodes 9a in each pixel row which are arranged in the X direction in FIG. 5 are at the same drive potential polarity. A pixel row in the 2n-th row (where n is a natural number) and a pixel row in the (2n−1)th row are driven so that the drive potential polarities are reversed from each other, and also any pixel row is driven so that the drive potential polarities are reversed for each field or frame. Thus, in FIG. 5, any two adjacent pixel electrodes 9a in the Y direction are constantly driven by opposite drive potential polarities, so that lateral electric fields are generated therebetween.

When the 1H inversion driving is employed in that manner, in the present exemplary embodiment, the protection insulating film 501 formed over the planarized fourth interlayer insulating film 44 preferably defines bank shapes extending in a striped pattern along, of the gaps between the pixel electrodes 9a, gaps where the lateral electric fields are generated between the pixel electrodes 9a, i.e., along the X direction in FIG. 5.

Figure 13:
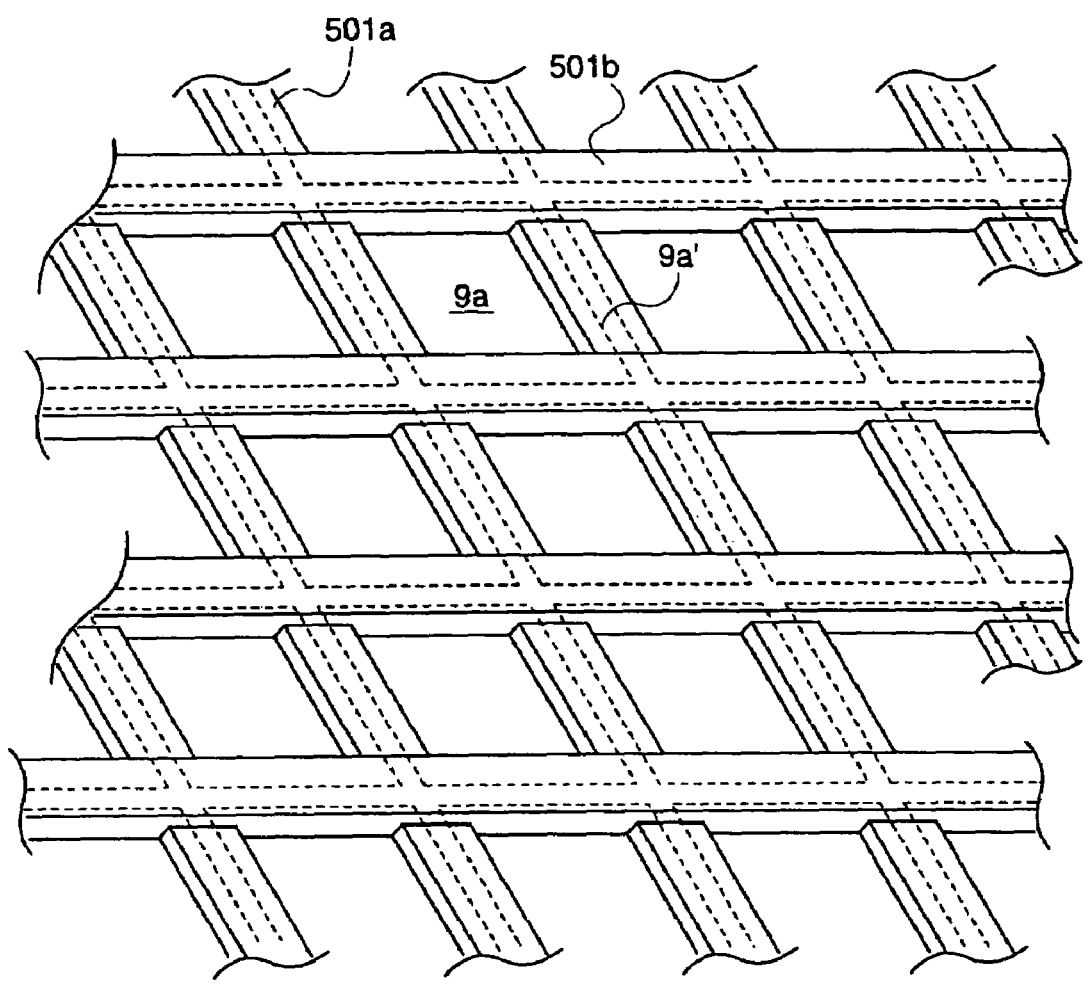
FIG. 13 is a first perspective view showing a protection insulating film according to an exemplary embodiment of the present invention.

Alternatively, as illustrated in a first perspective view in FIG. 13 in which protection insulating film according to an exemplary embodiment of the present invention is shown, of the protection insulating film, portions that extend so as to correspond to the scan lines have a greater height relative to the surfaces of the pixel electrodes than portions that extend so as to correspond to the data lines. An x-direction protection insulating film 501b that extends in a striped pattern along the X direction so as to reduce lateral electric fields has a relatively greater height and a y-direction protection insulating film 501a that extends in a striped pattern along the Y direction and that is substantially irrelevant to the lateral electric fields has a relatively smaller height. That is, portions of the protection insulating film 501a, which are irrelevant to the lateral electric fields, are especially configured to have such a height or shape enough to reduce material residues of the alignment layer 16.

Similarly, when the above-noted 1S inversion driving is adopted, in the present exemplary embodiment, the protection insulating film 501 formed on the planarized fourth interlayer insulating film 44 preferably defines bank shapes extending in a striped pattern along the Y direction in FIG. 5.

Figure 14:
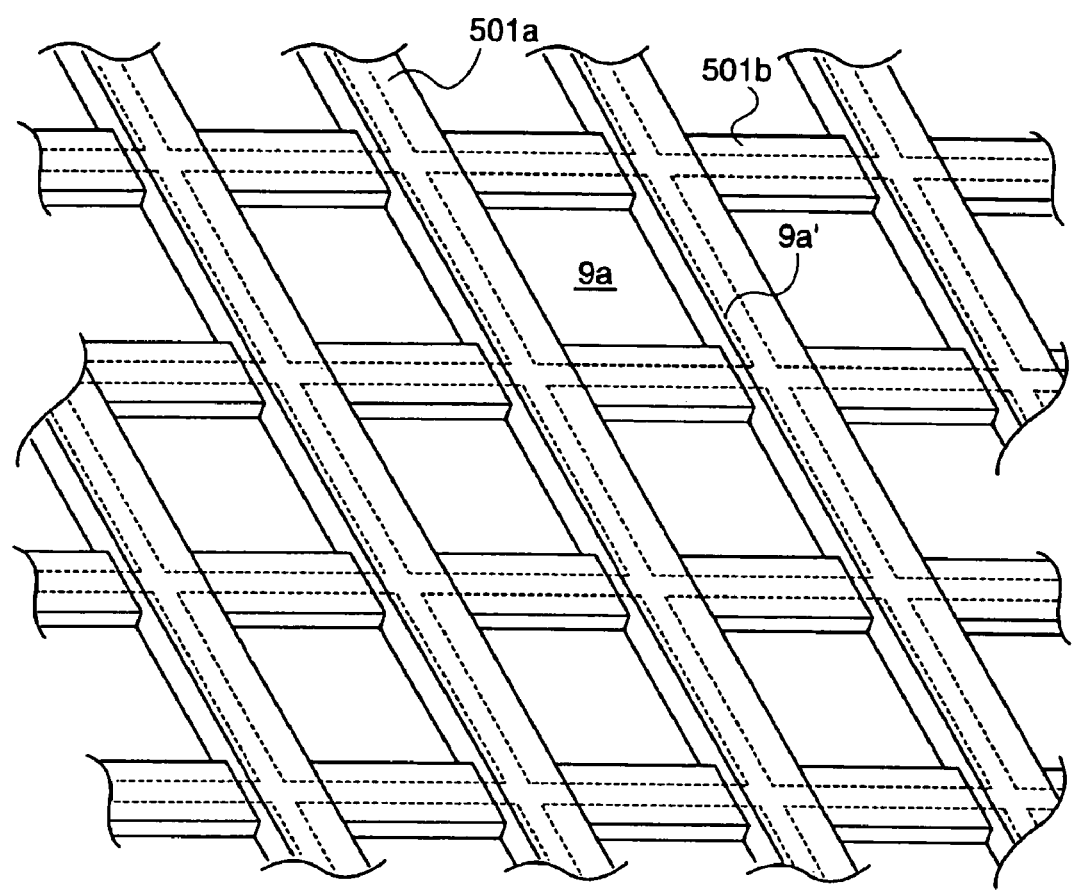
FIG. 14 is a second perspective view showing a protection insulating film according to an exemplary embodiment of the present invention.

Alternatively, as illustrated in a second perspective view in FIG. 14 in which protection insulating film according to the exemplary embodiment of the present invention is shown, of the protection insulating film, portions that extend so as to correspond to the scan lines have a smaller height relative to the surfaces of the pixel electrodes than portions that extend so as to correspond to the data lines. The y-direction protection insulating film 501a that extends in a striped pattern along the Y direction, so as to reduce lateral electric fields, have a relatively greater height and the x-direction protection insulating film 501b that extends in a striped pattern along the X direction and that is substantially irrelevant to lateral electric fields has a relatively smaller height.

Figure 15:
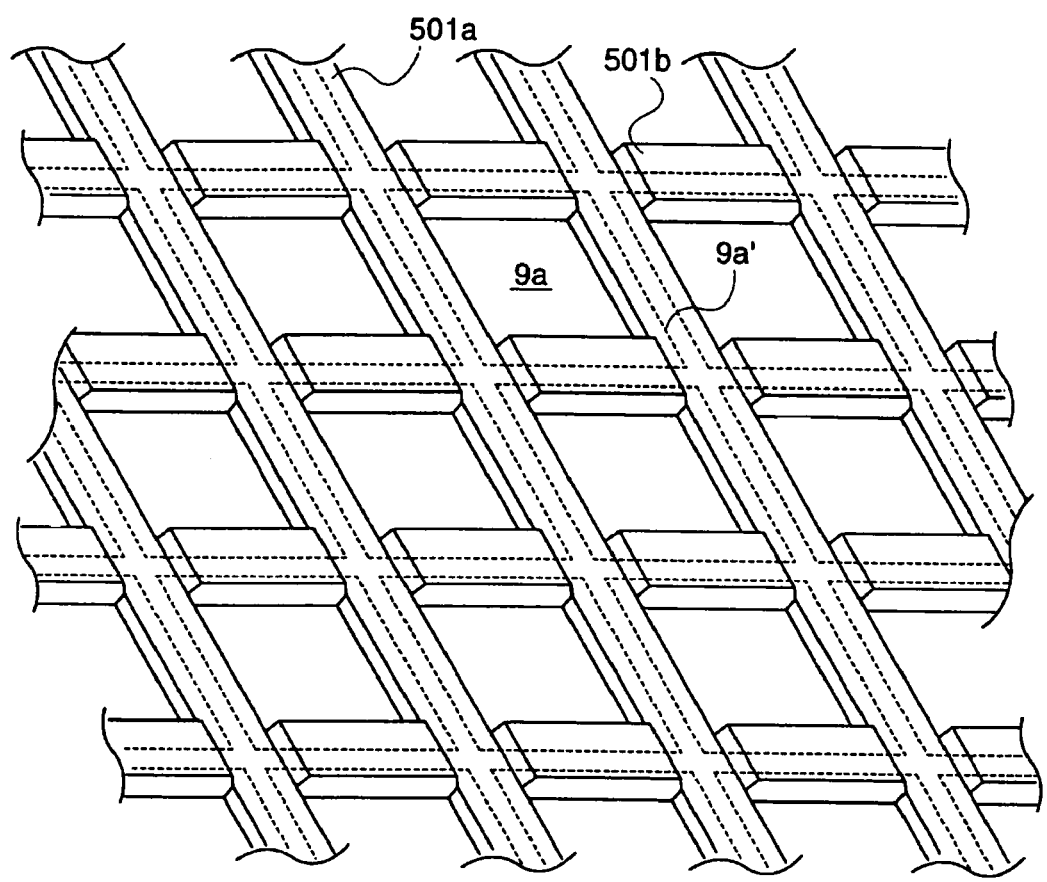
FIG. 15 is a third perspective view showing a protection insulating film according to an exemplary embodiment of the present invention.

FIG. 15 is a third perspective view showing a protection insulating film according to the exemplary embodiment of the present invention. What is different from FIG. 13 is that the height of the intersection regions of the protection insulating film in the lattice pattern from the pixel electrodes is aligned with the height from the lower portions, i.e., portions that extend so as to correspond to the data lines. In regions where no lateral electric field is applied, with respect to the entire regions including the intersection regions, the height from the pixel electrodes is reduced to minimize the generation of material residues of the alignment layer 16 at the time of rubbing.

Figure 16:
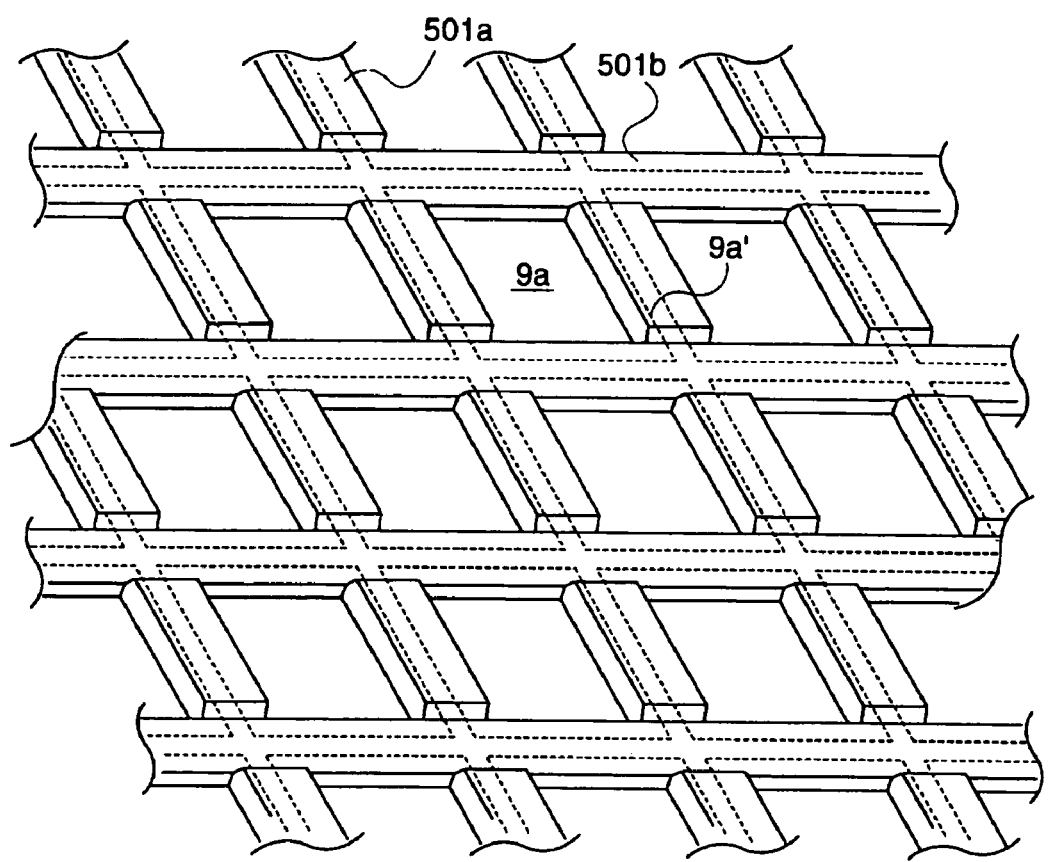
FIG. 16 is a fourth perspective view showing a protection insulating film according to an exemplary embodiment of the present invention.

FIG. 16 is a fourth perspective view showing a protection insulating film according to an exemplary embodiment of the present invention. What is different from FIG. 14 is that the height of the intersection regions of the protection insulating film in the lattice pattern from the pixel electrodes, as in FIG. 15, is aligned with the height from the lower portions, i.e., portions that extend so as to correspond to the scan lines.

In addition, when dot inversion driving, in which inversion driving is performed for each pixel, is adopted, in the present exemplary embodiment, the protection insulating film 501 formed on the planarized fourth interlayer insulating film 44 preferably defines bank shapes extending in a lattice along the Y and X directions in FIG. 5.

When the protection insulating film 501 is used to form a protection insulating film as described above, generally, the presence of only the protection insulating film can reduce the lateral electric fields with high accuracy.

In order to adequately reduce alignment failure that is caused in the liquid crystal layer 50 by protrusions/depressions or steps at the surface of the liquid crystal layer 50, to reduce adverse effects of lateral electric fields as described above, and to reduce material residues of the alignment layer 16, preferably, the film thickness of the protection insulating film 501 at portions where the protection insulating film 501 overlaps the edge portions of the pixel electrodes 9a is set to the range of one tenth to one fourth the inter-substrate gap (i.e., the layer thickness of the liquid-crystal layer 50). More specifically, for example, when the inter-substrate gap is about 2 to 4 µm, the film thickness of the protection insulating film 501 is set to about 0.2 to 1 µm. However, for the purpose of reducing at least material residues of the alignment layer 16, the range of film thickness of the protection insulating film 501 may be set greater or smaller than that range.

Manufacturing Process

Figure 8:
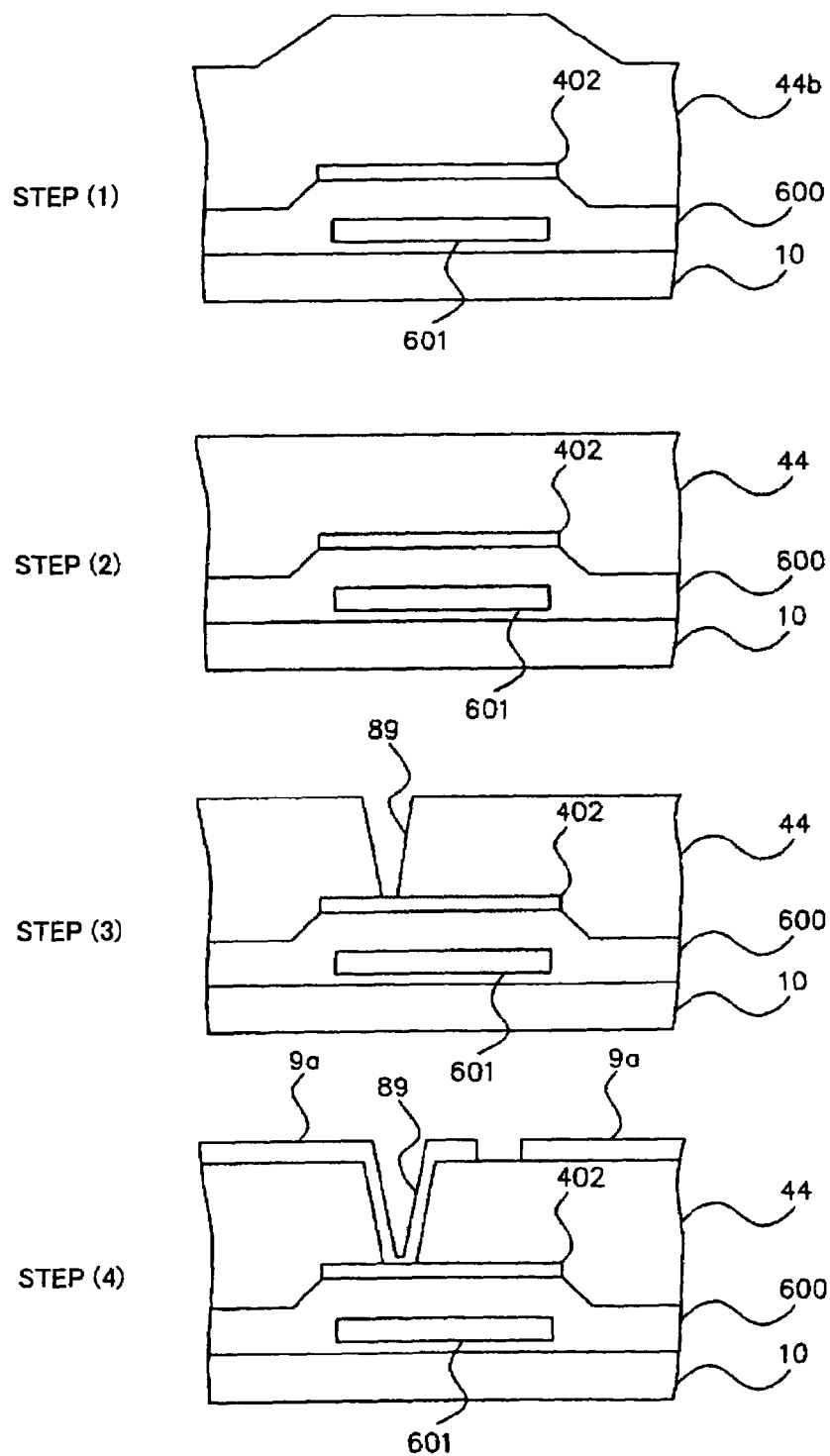
FIG. 8 is a (first) cross-section process view sequentially showing a manufacturing method for the electro-optical device according to an exemplary embodiment of the present invention.
Figure 9:
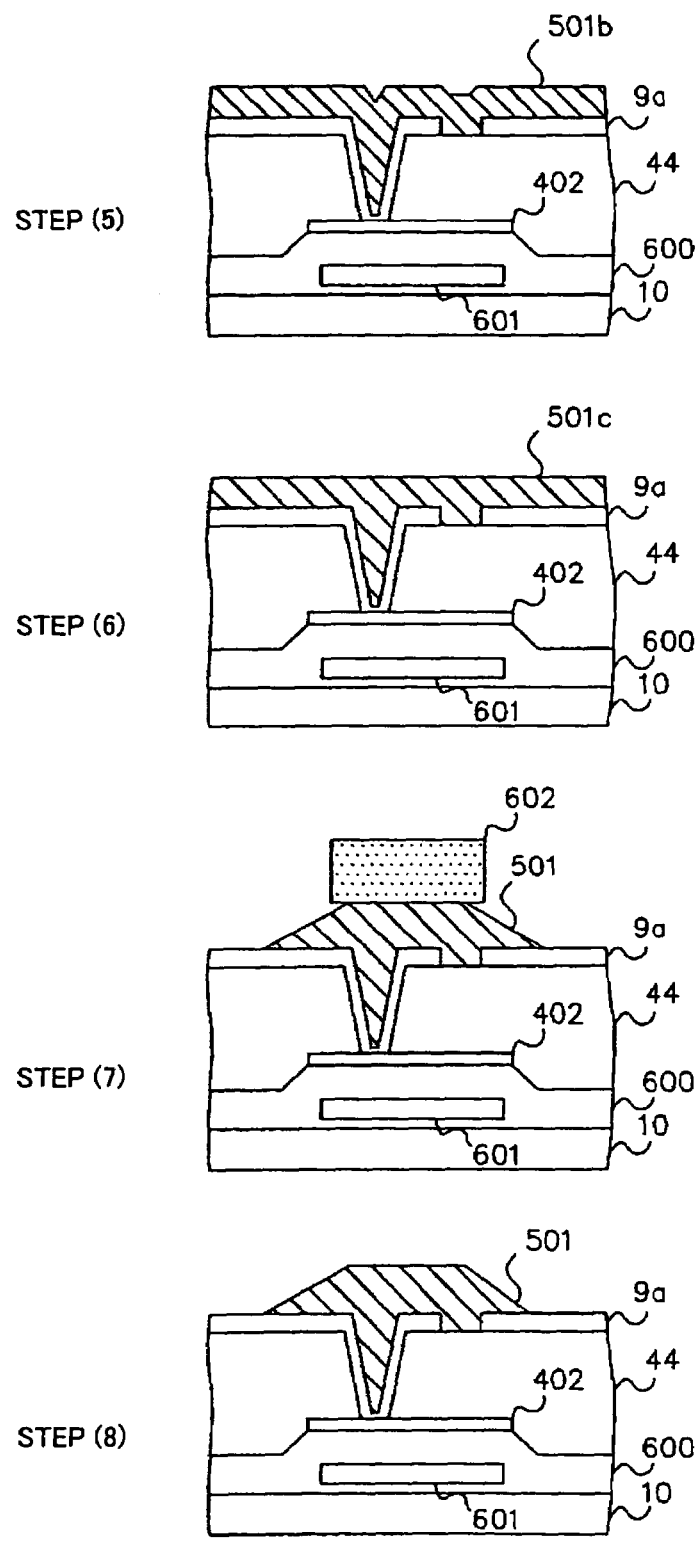
FIG. 9 is a (second) cross-section process view sequentially showing the manufacturing method for the electro-optical device according to an exemplary embodiment of the present invention.

A manufacturing process of the electro-optical device configured as described above, mainly, a process for the protection insulating film 501 described with reference to FIGS. 2 to 4, will be described with reference to with reference to FIGS. 8 and 9. FIGS. 8 and 9 are figures of a series of manufacturing processes of the electro-optical device according to an aspect of the present invention, illustrating a cross sectional portion indicated by reference character Ae in the vicinity of the contact hole shown in FIG. 3.

First, in step (1) shown in FIG. 8, the TFT array substrate 10, such as a quartz substrate, hard glass, or silicon substrate, are prepared, and a multilayer structure 600, in which the various-wire/electronic-elements 601 are fabricated, is provided on the TFT array substrate 10 using a planar technique. Specifically, the scan line 11a, the TFT 30, the storage capacitors 70, the data line 6a, the relay electrode, and the like are sequentially formed by a deposition process, doping process, patterning process, annealing process, or the like for a conductive film or semiconductor film. Thus, a multilayer structure including the various-wire/electronic-elements 601 is fabricated on the TFT array substrate 10, and the third relay electrode 402 is formed on the structure. Further, an insulating film 44b is formed on the resulting structure.

In this case, the third relay electrode 402 is formed with a multilayer-structure conductive film by, for example, sputtering or plasma CVD. More specifically, a first layer is formed of, for example, a low-resistance material, such as aluminum, on the uppermost layer (e.g., the third interlayer insulating film 43) of the multilayer structure 600, and then, on the first layer, a second layer is formed of, for example, titanium nitride and other material that does not cause electrolytic corrosion with ITO constituting the pixel electrode 9a described below. Lastly, the first layer and the second layer are patterned to shape a third relay electrode 402 having a two-layer structure. Further, at the same time the third relay electrode 402 is formed, the shield layer 400 (see FIGS. 5 to 7) can be formed.

Meanwhile, the interlayer insulating film 44b is formed of for example, a silicate glass film containing NSG (nonsilicate glass), PSG (phosphosilicate glass), BSG (borosilicate glass), or BPSG (borophosphorosilicate glass), a silicon oxide film, or a silicon nitride film, by atmospheric-pressure CVD or reduced-pressure CVD using a TEOS (tetraethylorthosilicate) gas, TEB (tetraethyl borane) gas, TMOP (Tetramethoxy-phospholate) gas, or the like. The insulating film 44b has a film thickness of, for example, about 500 to 2000 nm. At this stage, the surface of the insulating film 44b has protrusions/depressions because of the influence of various wires and electronic elements fabricated in the multilayer structure 600.

Next, in step (2) shown in FIG. 8, the surface of the insulating film 44b is planarized by a CMP process to provide the fourth interlayer insulating film 44. Specifically, the surface of the insulating film 44b is polished in such a manner that, for example, while liquid slurry (a chemical polishing liquid) containing silica grains is fed onto a polishing pad fixed on a polishing plate, the substrate surface (the insulating film 44b side) secured to a spindle is brought into contact therewith and is rotated. The polishing process is then stopped by managing time or by pre-forming an appropriate stopper layer at a predetermined position. This provides the planarized fourth interlayer insulating film 44, which has a thickness of, for example, about 500 to 1500 nm.

Next, in step (3) shown in FIG. 8, the contact hole 89 extending to the third relay electrode 402 is provided by dry etching, such as reactive ion etching or reactive ion beam etching. The side wall of the contact 89, however, may be tapered to some extent by wet etching or the combination of dry etching and wet etching.

Next, in step (4) shown in FIG. 8, a transparent conductive film, such as an ITO film, is deposited on the fourth interlayer insulating film 44 by sputtering or the like to have a thickness of about 50 to 200 nm. The pixel electrodes 9a are then formed by photolithography or etching. Further, when the electro-optical device is used as a reflective-type device, each pixel electrode 9a may be formed of an opaque material having a high reflective index, such as Al.

In step (5) shown in FIG. 9, the insulating film 501b, which is made of a silicate glass film, such as NSG, PSG, BSG, BPSG, a silicon nitride film, or silicon oxide film, is formed over the pixel electrodes 9*a* and the fourth interlayer insulating film 44 exposed from the gap therebetween by, for example, atmospheric-pressure CVD or reduced-pressure CVD using a TEOS gas, TEB gas, TMOP gas, or the like. The first interlayer insulating film 41 has a film thickness of, for example, about 50 to 500 nm. It is preferable that the insulating film 501*b* be formed below a predetermined process temperature that does not damage various electrodes including pixel electrodes 9*a*, wires, electronic elements that have already been formed on and above the TFT array substrate 10, depending on the material and the like of the pixel electrodes 9*a*. In this case, for example, the insulating film 501*b* may be annealed at a low temperature of about 400° C. to enhance the film quality thereof.

In step (6) shown in FIG. 9, the upper surface of the insulating film 501*b* is planarized by a CMP process, etch-back process, or the like to thereby provide an insulating film 501*c* having the planarized upper surface. Further, it is also possible to form the planarized insulating film 501*c* by spin coating.

Next, in step (7) shown in FIG. 9, a photoresist 602 is formed at a region indicated by hatching in FIG. 2 by a photolithography technique and the protection insulating film 501 is patterned by etching using the photoresist 602 as a mask. In this case, wet etching is used to form the protection insulating film 501 having end surfaces with a gentle taper angle of, preferably, 45° or less and, more preferably, 30° or less.

In step (8) shown in FIG. 9, the photoresist 602 is released to thereby expose, the protection insulating film 501. Over the resulting structure, a polyimide coating for an alignment layer is provided and is then rubbed in a predetermined rubbing direction so as to have a predetermined pre-tilt angle, thereby completing the alignment layer 16 (see FIGS. 3 and 7).

Through the process described above, of the electro-optical device, the TFT array substrate 10 having the protection insulating film 501 as shown in FIGS. 2 and 3 is completed.

On the other hand, with regard to the opposing substrate 20, a glass substrate is first prepared, and, for example, chromium metal is sputtered thereon. Then, a light-shielding film, which serves as a frame, is formed through photolithography and etching. Thereafter, a transparent conductive film containing ITO or the like is deposited over an entire surface of the opposing substrate 20 by sputtering so as to have a thickness of about 50 to 200 nm, thereby forming the opposing electrode 21. Additionally, for example, an entire surface of the opposing electrode 21 is coated with a polyimide coating for an alignment layer and is then rubbed in a predetermined direction so as to have a predetermined pre-tilt angle, thereby forming an alignment layer 22.

Lastly, as described above, the TFT array substrate and the opposing substrate 20, which have the individual layers, are laminated with a sealant such that the alignment layers 16 and 22 oppose each other. Liquid crystal made of, for example, a mixture of multiple types of nematic liquid crystal is suctioned into the space between the substrates by vacuum suction or the like to form the liquid-crystal layer 50 having a predetermined layer thickness.

According to the manufacturing process described above, it is possible to manufacture the electro-optical device of the exemplary embodiment described above.

As described in detail in the above, according to the manufacturing process of the present exemplary embodiment, through steps (5) to (8) shown in FIG. 9, the protecting insulating film 501 is formed above the array substrate 10 so as to cover the end surfaces of the edge portions of the pixel electrodes 9*a* and so as to overlap the edge portions of the pixel electrodes 9*a*. In parallel thereto, the protection insulating film 501 is formed so as to cover the vicinities of the contact holes 89. Thereafter, the alignment layer 16 is provided and is rubbed. Thus, during the rubbing process, it is possible to effectively reduce or prevent material residues of the alignment layer 16, such as polyimide residues, from being generated and trapped at steps in the vicinities of the edges of the pixel electrodes 9*a* and in the vicinities of the contact holes 89.

Overall Configuration of Electro-Optical Device

Figure 10:
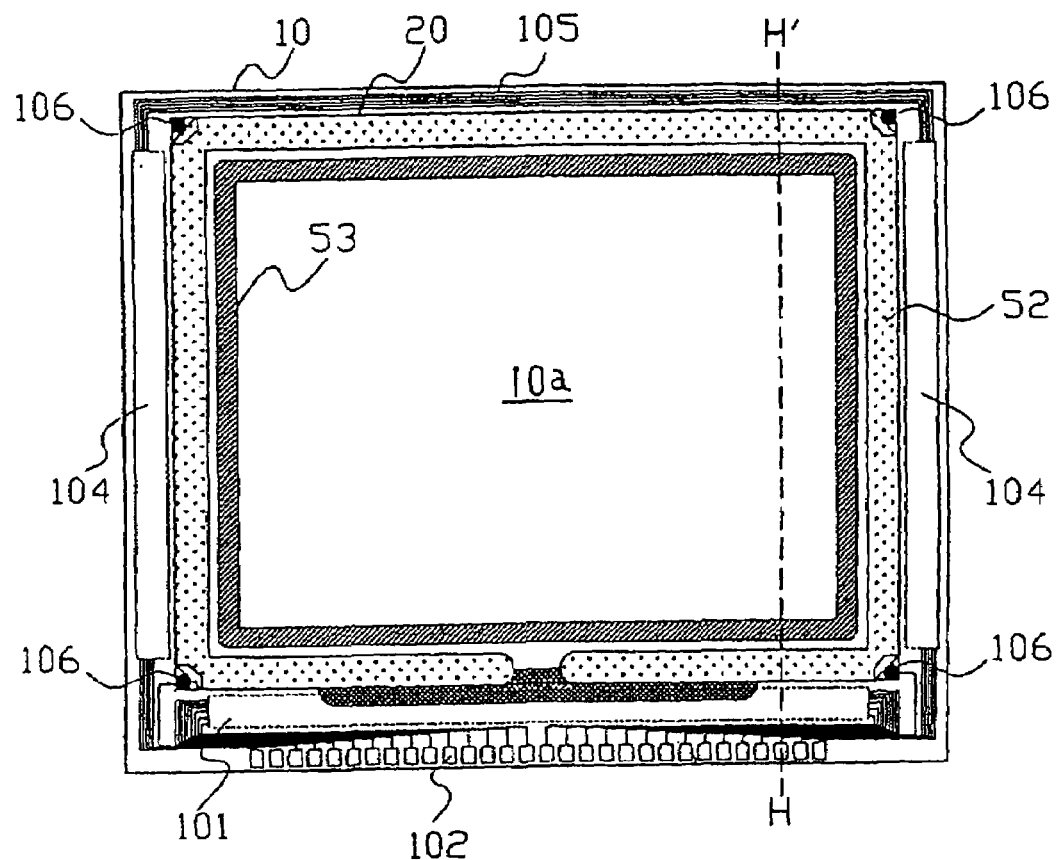
FIG. 10 is a plan view of the TFT array substrate and various elements formed thereon in the electro-optical device of an exemplary embodiment of the present invention, which is viewed from an opposing substrate side.
Figure 11:
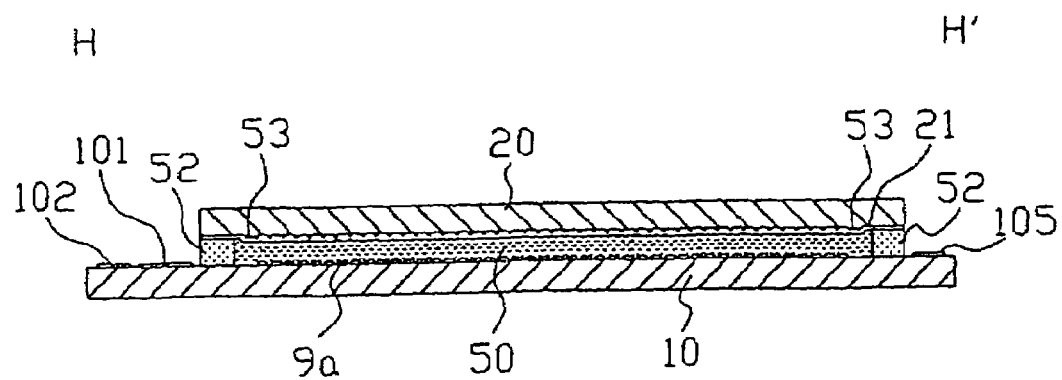
FIG. 11 is a cross-sectional view taken along the plane H–H' shown in FIG. 10.

The overall configuration of the electro-optical device configured described above according to the present exemplary embodiment will be described below with reference to FIGS. 10 and 11. FIG. 10 is a plan view of the TFT array substrate and individual elements formed thereon, viewed from the opposing substrate 20 side. FIG. 11 is a cross-sectional view taken along the plane H–H' shown in FIG. 10.

Referring to FIGS. 10 and 11, in the electro-optical device according to the present invention, the TFT array substrate 10 and the opposing substrate 20 are arranged so as to oppose each other. The liquid-crystal layer 50 is contained between the TFT array substrate 10 and the opposing substrate 20, which are joined to each other by a sealant 52 that is provided in a seal area placed around the image display area 10*a*.

For example, the sealant 52 is made of an ultraviolet curable resin, a thermosetting resin, or the like, and is cured by ultraviolet or heat to laminate both the substrates. Also, when the electro-optical device of the present exemplary embodiment is applied to a compact liquid-crystal apparatus, such as a projector to display an enlarged image, gap members (spacers), such as glass fibers or glass beads, are dispersed in the sealant 52 to keep the distance between the substrates (inter-substrate gap) at a predetermined value. Alternatively, when the electro-optical device is applied to a large liquid-crystal apparatus, such as liquid-crystal display or a liquid-crystal television to display an image by the equal magnification, such gap members may be contained in the liquid crystal layer 50.

The data-line drive circuit 101 and an outer-circuit connecting terminal 102 are provided at a region outside the sealant 52 along one edge of the TFT array substrate 10. The data-line drive circuit 101 drives the data lines 6*a* by supplying image signals to the data lines 6*a* at a predetermined timing. Along two edges adjacent to the one edge are provided scan-line drive circuits 104. The scan-line drive circuits 104 drive the gate electrodes 3*a* by supplying scan signals to the scan lines 11*a* and the gate electrodes 3*a* at a predetermined timing.

If delay of scan signals supplied to the scan lines 11*a* and the gate electrodes 3*a* is not a problem, it goes without saying that the scan-line drive circuit 104 may be provided at only one side. The data-line drive circuits 101 may also be arranged at two sides along edges of the image display area 10*a*.

Along the remaining edge of the TFT array substrate 10 are provided wires 105 to provide connections between the scan-line drive circuits 104 provided at the opposing two sides of the image display area 10*a*.

A conductive material 106 is also provided at at least one of the corner portions of the opposing substrate 20 to provide electrical connection between the TFT array substrate 10 and the opposing substrate 20.

Referring to FIG. 11, above the TFT array substrate 10, after the pixel switching TFTs and wires, such as scan lines, data lines, and the like are provided, an alignment layer is formed on the pixel electrodes 9a. On the other hand, above the opposing substrate 20, an alignment layer is formed at the uppermost layer portion, in addition to the opposing electrode 21. The liquid-crystal layer 50 is made of liquid crystal containing one type or a mixture of multiple types of nematic liquid crystal, and is in a predetermined alignment state between the pair of alignment layers.

On the TFT array substrate 10, a sampling circuit to supply image signals to the data lines 6a at a predetermined timing; a precharge circuit to supply precharge signals, which precede image signals and have a predetermined voltage level, to the data lines 6a; and an inspection circuit to inspect the quality, a defect, and the like of the electro-optical device during manufacture or shipment; and the like may also be provided, in addition to the data-line drive circuit 101, the scan-line drive circuits 104, and the like.

In the exemplary embodiment described above, instead of providing the data-line drive circuit 101 and the scan-line drive circuits 104 on the TFT array substrate 10, for example, electrical and mechanical connection may be provided for a drive LSI that is mounted on a TAB (tape automated bonding) substrate via an anisotropic conductive film that is provided at the peripheral portion of the TFT array substrate 10. Depending on the operation modes, such as a TN (twisted nematic) mode, VA (vertically aligned) mode, or PDLC (polymer dispersed liquid crystal) mode and a normally white mode or normally black mode, for example, a polarizing film, a retardation film, and a polarizer are arranged in a predetermined direction on one side, to which projection light enters, of the opposing substrate 20, and on one side, from which light is emitted, of the TFT array substrate 10.

Electronic Apparatus

Figure 12:
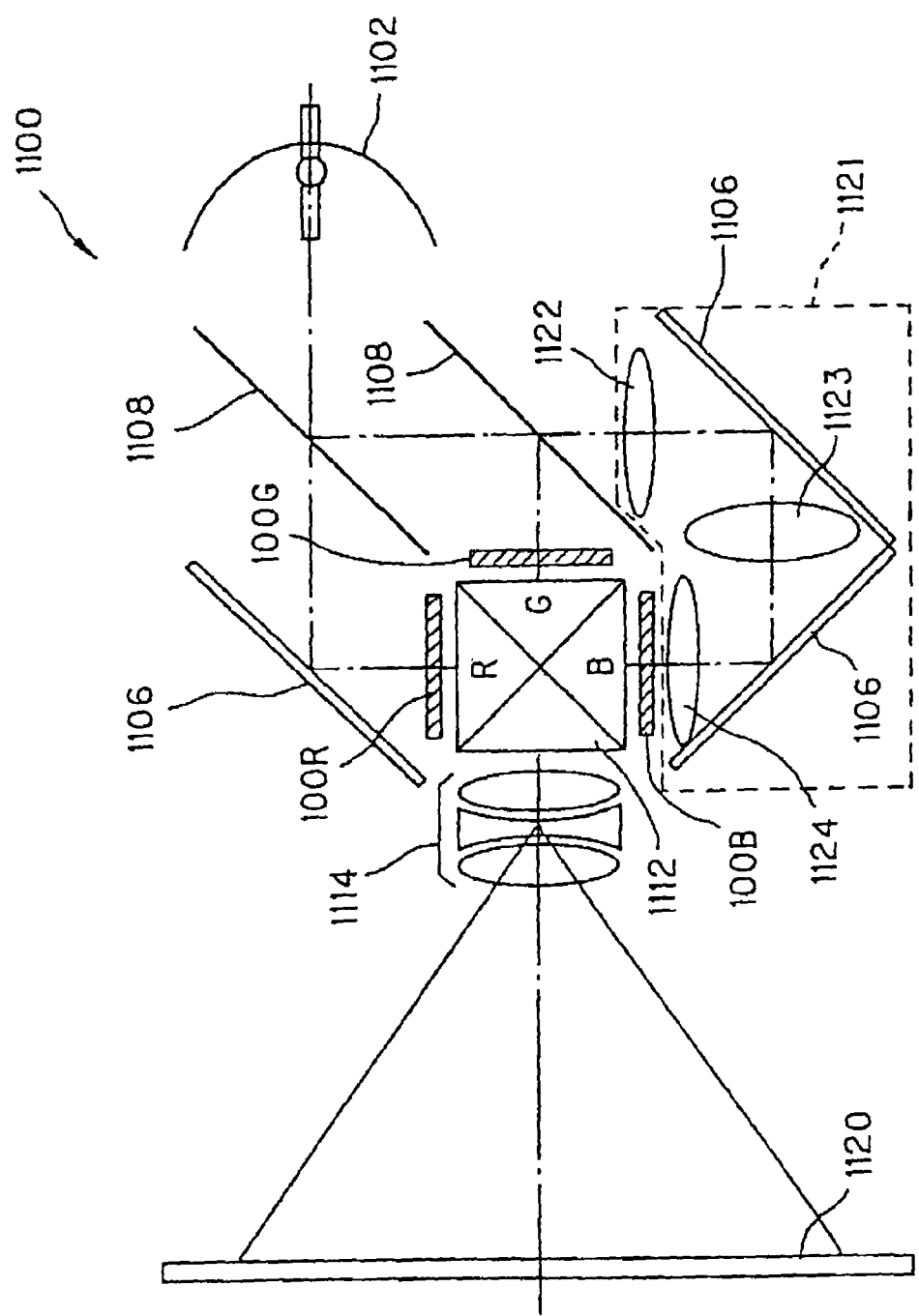
FIG. 12 is a schematic sectional view showing a color liquid-crystal projector, which is one example of a projection-type color display apparatus, according to an exemplary embodiment of an electronic apparatus of the present invention.

Next, a description is given of the entire configuration and, particularly, the optical configuration of an exemplary embodiment of a projection-type color display apparatus that is one example of an electronic apparatus using the electro-optical device detailed above as a light valve. FIG. 12 is a schematic sectional view of a projection-type color display apparatus.

Referring to FIG. 12, a liquid crystal projector 1100, which is one example of a projection-type color display apparatus of this exemplary embodiment, is configured in such a manner that three liquid-crystal modules, each including a liquid-crystal device in which a drive circuit is mounted on a TFT array substrate, are prepared and used as light valves 100R, 100G, and 100B for respective RGB. In the liquid crystal projector 1100, when projection light is emitted from a lamp unit 1102 which includes a white light source, such as a metal halide lamp, three mirrors 1106 and two dichroic mirrors 1108 divide the projection light into R, G, and B light components corresponding to the three primary colors R, G, and B. The three R, G, and B light components are then introduced into the light valves 100R, 100G, and 100B, respectively. In this case, to reduce or prevent optical loss due to a long optical path, the B light ray is particularly introduced through a relay lens system 1121, which includes a light-entrance lens 1122, a relay lens 1123, and a light-emission lens 1124. Light components that are modulated by the corresponding light valves 100R, 100G, and 100G and that correspond to the three primary colors are again combined by a dichroic prism 1112. Subsequently, the resulting light components are projected as a color image onto a screen 1120 via a projection lens 1114.

The present invention is not limited to the embodiments described above. The present invention, therefore, can be changed as appropriate without departing from the scope or sprit of the present invention and an electro-optical device, a manufacturing method therefor, and an electronic apparatus which involve such a change are also encompassed by the technical scope of the present invention.

What is claimed is:

1. An electro-optical device comprising:
   an electro-optic material sandwiched between a pair of substrates;
   a plurality of pixel electrodes that are arranged with gaps therebetween in plan view above one of the substrates;
   an underlying layer that underlies the pixel electrodes;
   at least one of wires and electronic elements which are formed below the underlying layer and which are electrically connected to the pixel electrodes;
   a protection insulating film that is formed on at least part of the underlying layer in the gaps and that is formed on edge portions of the pixel electrodes so as to cover end surfaces of the edge portions of the pixel electrodes;
   an alignment layer that is provided on the protection insulating film and the pixel electrodes; and
   edge portions of the protecting insulating film having, at edges of the edge portions, tapered portions with a taper angle of 45° or less.

2. The electro-optical device according to claim 1, the underlying layer being planarized.

3. The electro-optical device according to claim 1, the protection insulating film being planarized.

4. The electro-optical device according to claim 1, the pixel electrodes being connected to at least one of the wires and the electronic elements via corresponding contact holes, and
   the protection insulating film being formed so as to cover depression portions of the pixel electrodes, the depression portions corresponding to the openings of the contact holes.

5. The electro-optical device according to claim 1, further comprising:
   a light-shielding film provided above at least one of the substrates, the light-shielding film covering planar regions where the protection insulating film is formed, so as to correspond to regions where no pixel apertures are provided.

6. The electro-optical device according to claim 1, the taper angle being 30° or less.

7. The electro-optical device according to claim 1, of the edge portions of the protection insulating film, the tapered portions being provided at portions extending in a direction that intersects a predetermined rubbing direction.

8. The electro-optical device according to claim 1, the protection insulating film being formed so as not to lie on center portions of the pixel electrodes.

9. The electro-optical device according to claim 1, at least one of the wires and the electronic elements including scan lines and data lines which intersect each other and thin-film transistors that control the switching of the pixel electrodes, scan signals and image signals being supplied to the thin-film transistors through the scan lines and the data lines, respectively, and
   the protection insulating film extending in a striped pattern or a lattice pattern in plan view along the gaps corresponding to the scan lines and the data lines.

10. The electro-optical device according to claim 9, each of the pixel electrodes being driven by potential-polarity reversal via a corresponding one of the thin-film transistors, for each row of pixel electrodes extending in the row direction or for each column of pixel electrodes extending in the column direction, and the protection insulating film extending in a striped pattern along, of the gaps, gaps where lateral electric fields are generated between the pixel electrodes.

11. The electro-optical device according to claim 1, the protection insulating film extending in a striped pattern along the gaps between two adjacent pixel electrodes that drive the electro-optic material with polarities different from each other relative to a reference potential.

12. The electro-optical device according to claim 1, of the protection insulating film, regions that extend in a striped pattern along the gaps between two adjacent pixel electrodes that drive the electro-optic material with polarities different from each other relative to a reference potential having a greater height from the pixel electrodes than the other regions of the protection insulating film.

13. The electro-optical device according to claim 1, the protection insulating film being provided at regions in the vicinities of the gaps between two adjacent pixels electrodes that drive the electro-optic material with polarities different from each other relative to a reference potential.

14. The electro-optical device according to claim 1, of the protection insulating film, regions in the vicinities of the gaps between two adjacent pixel electrodes that drive the electro-optic material with polarities different from each other relative to a reference potential having a greater height from the pixel electrodes than the other regions of the protection insulating film.

15. The electro-optical device according to claim 1, the film thickness of the protection insulating film at portions where the protection insulating film being provided on the edge portions is in the range of one tenth to one fourth the gap between the substrates.

16. An electronic apparatus, comprising:
the electro-optical device according to claim 1.

17. An electro-optical device comprising:
an electro-optic material sandwiched between a pair of substrates;

a plurality of pixel electrodes that are arranged with gaps therebetween in plan view above one of the substrates;

an underlying layer that underlies the pixel electrodes;

at least one of wires and electronic elements which are formed below the underlying layer and which are electrically connected to the pixel electrodes;

a protection insulating film that is formed on at least part of the underlying layer in the gaps and that is formed on edge portions of the pixel electrodes so as to cover end surfaces of the edge portions of the pixel electrodes, the protection insulating film including first portions and second portions, the first portions extending so as to correspond to one direction of wires and in which lateral electric fields are generated, the second portions extending so as to correspond to another direction of wires crossing the one direction and being substantially irrelevant to the lateral electric fields, the first portions having a greater height relative to surfaces of the pixel electrodes than the second portions; and an alignment layer that is provided on the protection insulating film and pixel electrodes.

18. An electro-optical device comprising:

an electro-optic material sandwiched between a pair of substrates;

a plurality of pixel electrodes that are arranged with gaps therebetween in plan view above one of the substrates;

an underlying layer that underlies the pixel electrodes;

at least one of wires and electronic elements which are formed below the underlying layer and which are electrically connected to the pixel electrodes;

a protection insulating film that is formed on at least part of the underlying layer in the gaps and that is formed on edge portions of the pixel electrodes so as to cover end surfaces of the edge portions of the pixel electrodes, the protection insulating film being made of a silicate glass film formed by CVD; and an alignment layer that is provided on the protection insulating film and pixel electrodes.

* * * * *